United States Patent
Xue

(10) Patent No.: US 8,772,443 B2
(45) Date of Patent: Jul. 8, 2014

(54) WATER SOLUBLE NEAR INFRARED SENSING POLYMERS WITH LOW BAND GAPS

(75) Inventor: Cuihua Xue, Irvine, CA (US)

(73) Assignees: Hitachi Chemical Co., Ltd., Tokyo (JP); Hitachi Chemical Research Center, Irvine, CA (US)

( * ) Notice: Subject to any disclaimer, the term of this patent is extended or adjusted under 35 U.S.C. 154(b) by 0 days.

(21) Appl. No.: 13/580,799

(22) PCT Filed: Mar. 28, 2011

(86) PCT No.: PCT/US2011/000557
§ 371 (c)(1), (2), (4) Date: Aug. 23, 2012

(87) PCT Pub. No.: WO2011/119239
PCT Pub. Date: Sep. 29, 2011

(65) Prior Publication Data
US 2012/0322944 A1 Dec. 20, 2012

Related U.S. Application Data

(60) Provisional application No. 61/318,114, filed on Mar. 26, 2010.

(51) Int. Cl.
*C08G 75/00* (2006.01)
(52) U.S. Cl.
USPC ........... 528/380; 528/377; 528/378; 525/54.2
(58) Field of Classification Search
USPC .................................. 525/54.2; 528/377, 380
See application file for complete search history.

(56) References Cited

U.S. PATENT DOCUMENTS

| | | |
|---|---|---|
| 6,350,431 B1 | 2/2002 | Snow et al. |
| 2007/0017571 A1 | 1/2007 | Gaudiana et al. |
| 2009/0221762 A1 | 9/2009 | Therien et al. |
| 2010/0048815 A1 * | 2/2010 | Ying et al. ............... 525/54.2 |

OTHER PUBLICATIONS

Written Opinion of the International Searching Authority (Form PCT/ISA/237) issued on May 12, 2011, by the US Patent Office as the International Searching Authority in PCT/US2011/000557.
International Search Report issued on May 23, 2011, by the US Patent Office in International Patent Application No. PCT/US2011/000557.

* cited by examiner

*Primary Examiner* — Shane Fang
(74) *Attorney, Agent, or Firm* — Dentons US LLP

(57) ABSTRACT

The present invention is directed to polymeric materials including a copolymer of at least a first and second monomer that have desirable electrical and optical properties, such as a low band gap and near infrared (NIR) absorption, respectively. More specifically, the present invention is directed to polymeric materials with charge neutrality that display increased solubility in aqueous media while retaining their electrical and optical properties. The polymeric materials in accordance with the present invention can be modified with any desired functional group to tailor the polymer materials for a specific application. Also described are methods of making the polymeric materials in accordance with the present invention.

9 Claims, 7 Drawing Sheets

WATER SOLUBLE NEAR INFRARED SENSING POLYMERS WITH LOW BAND GAPS

CROSS-REFERENCE TO RELATED APPLICATIONS

This application is a National Stage of PCT/US2011/000557, filed Mar. 28, 2011, and designating the United States (published in English on Sep. 29, 2011, as WO 2011/119239 A1; the title and abstract were also published in English), which claims priority to U.S. Provisional Patent Application No. 61/318,114, filed Mar. 26, 2010, each hereby expressly incorporated by reference in its entirety and each assigned to the assignee hereof.

FIELD

The present disclosure relates to polymeric compositions, and related methods and uses.

BACKGROUND

In this specification where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

Near-infrared (NIR) fluorescent dyes have received attention in recent years. However, despite the advantages of polymers and their use in the NIR range, the currently available NIR dyes are all small molecules with a single reactive site. NIR polymers, especially water-soluble NIR polymers with multiple reactive sites and low band gaps are still lacking. Water solubility is a beneficial property for dyes to be used in many applications. The use of NIR polymers for such applications has been hampered by lack of water solubility.

A conventional method of making molecules water-soluble is to introduce charges to their molecular structures. Introduction of charges significantly enhances water solubility of molecules, like all the commercially available water-soluble dyes which are charged molecules. However, the presence of charges in molecules could cause potential interfering responses due to non-specific electrostatic interactions in complicated biological samples.

Thus, there is a need in the art for NIR polymers with low band gaps that demonstrate overall charge neutrality, water solubility and functionality.

While certain aspects of conventional technologies have been discussed to facilitate disclosure of the invention, Applicants in no way disclaim these technical aspects, and it is contemplated that the claimed invention may encompass or include one or more of the conventional technical aspects discussed herein.

SUMMARY

According to certain aspects of the invention, NIR polymers that combine a low band gap, charge neutrality, water solubility, and functionality in one package have been developed. These polymers have very good water solubility while retaining their NIR optical properties and neutrality, which renders them suitable for use in many applications that require high hydrophilic properties or water solubility.

According to certain aspects, the invention provides new materials that combines advantages of NIR dyes and multivalent binding functions of a polymer, as well as high water solubility into one package and thus offers a general and powerful platform suitable for use in numerous applications. Materials of the present invention may also feature low band gaps of between about 0.8 eV and about 1.7 eV and NIR optical properties.

According to one aspect, the present invention provides new materials of the general formulas shown below:

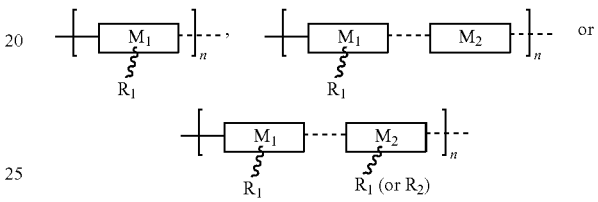

wherein:

$M_1$=substituted or un-substituted conjugated monomer, short conjugation block oligomer, alkene, or alkyne;

$M_2$=substituted or un-substituted monomer, short conjugation block oligomer, alkene, or alkyne with or without side chains;

∿∿∿∿ =oligo- or poly-ethylene glycol, alkyl chain with or without branches, conjugated chain with or without substitutes;

~~~~~~ =single bond, double bond or triple bond;

n=any integer greater than 1; and $R_1$ and $R_2$=any functional group, such as, without limitation, H, $CH_3$, alkene, alkyne, OH, Br, Cl, I, F, SH, COOH, $NH_2$, CHO, maleimide, NHS ester, any heterocyclic compounds that can form a metal complex, other applicable functional groups, and biological molecules such as, without limitation, carbohydrates, proteins, peptides, DNA, RNA, antibodies, antigens, enzymes, bacterias, redox molecules, host molecules, guest molecules, haptens, lipids, microbes, aptamers, sugars or the like; wherein:

Monomer $M_1$ and $M_2$ can have, without limitation, zero, one or more than one side chain ∿∿∿∿;

Side chain ∿∿∿∿ in monomer $M_1$ and $M_2$, without limitation, can be the same or different, or one side chain has at least one reactive group and another side chain has no reactive group;

$R_1$ and $R_2$, without limitation, can be the same or different, or one is functional group and another is non-functional group.

According to one aspect, the present invention provides a polymeric material comprising: a copolymer of a first monomer (1), (2) or (3); and a second monomer (4), (5), (6) or (7);

wherein, (1) comprises:

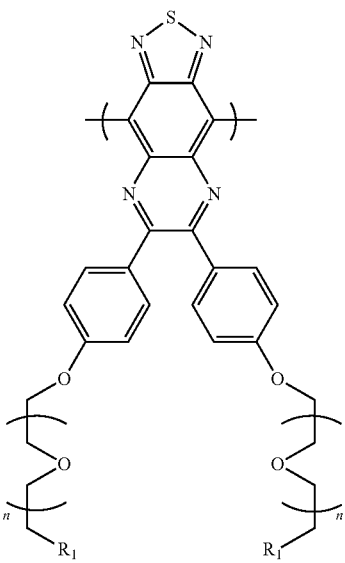

(2) comprises:

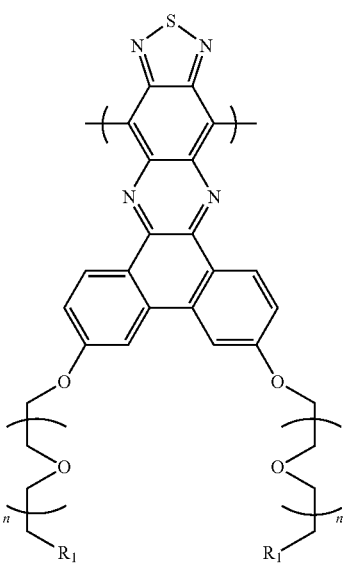

(3) comprises:

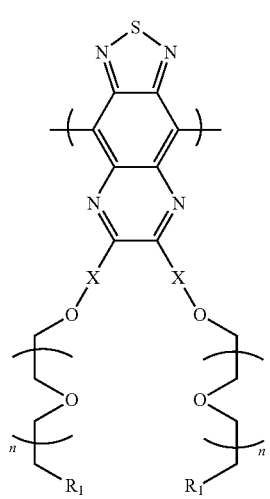

wherein $R_1$=OH, Br, I, Cl, SH, COOH, $NH_2$, $N(R_2)_3$ ($R_2$ can be same or different), $SR_2$, $SR_2COOH$, $SR_2NH_2$, $SR_2SO_3H$, $SR_2SH$, $SR_2OH$, malemide, or NHS ester, X=$C_0$-$C_3$ alkyl, aryl, substituted aryl, heteroaryl, or substituted heteroaryl, and $R_2$=Alkyl, aryl or heteroaryl, substituted aryl or substituted heteroaryl; and (4) comprises:

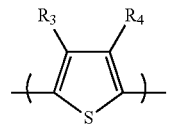

(5) comprises:

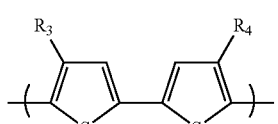

(6) comprises:

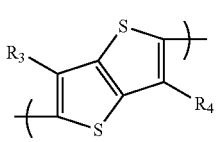

(7) comprises:

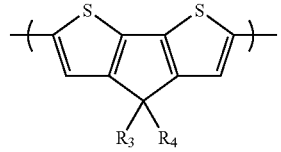

wherein $R_3$ and $R_4$=H or

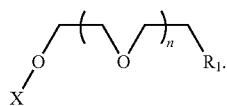

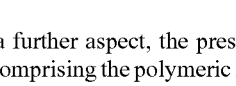

According to a further aspect, the present invention provides a polymer comprising the polymeric material described immediately above, and further comprising a third monomer (11), (12), (13), (14), (15), (16), (17), (18), or (19);

wherein:

(11)

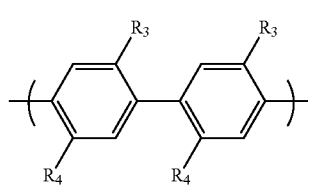

(12) 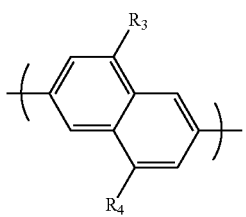
(13) 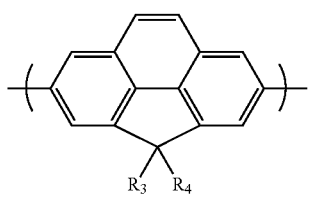
(14) 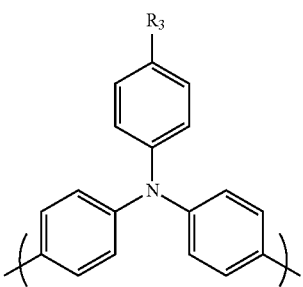
(15) 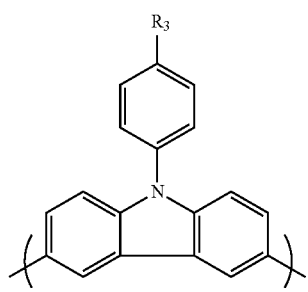
(16) 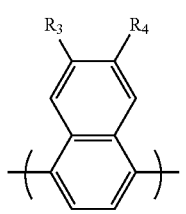
(17) 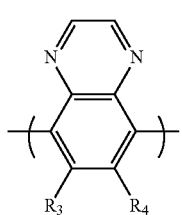
(18) 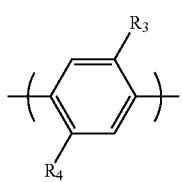
(19) 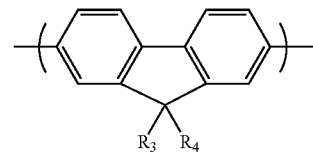
wherein $R_3$ and $R_4$=H or
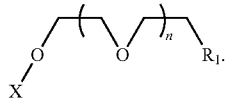
According to another aspect, the present invention provides polymeric material comprising: a copolymer of
a first monomer (8), (9) or (10); and
a second monomer (4), (5), (6) or (7);
wherein,
(8) comprises:
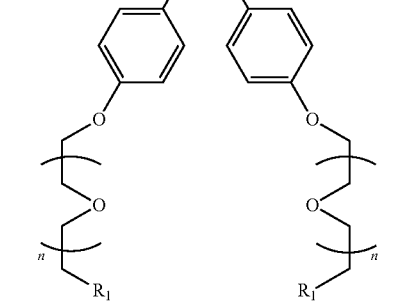
(9) comprises:
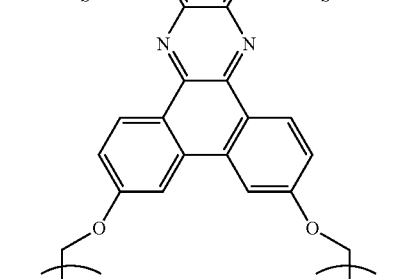

(10) comprises:

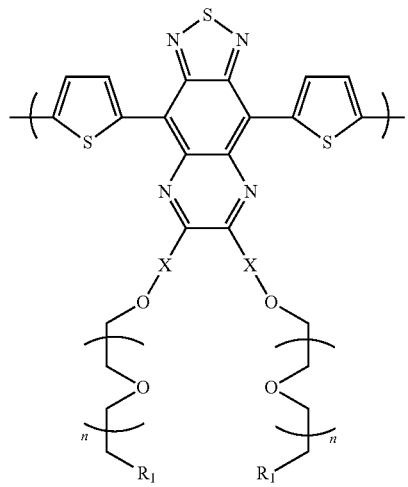

wherein

R$_1$=OH, Br, I, Cl, SH, COOH, NH$_2$, N(R$_2$)$_3$ (3R$_2$ can be same or different), SR$_2$, SR$_2$COOH, SR$_2$NH$_2$, SR$_2$SO$_3$H, SR$_2$SH, SR$_2$OH, malemide, or NHS ester, X=C$_0$-C$_3$ alkyl, aryl, substituted aryl, heteroaryl, or substituted heteroaryl, and R$_2$=Alkyl, aryl, heteroaryl, substituted aryl or substituted heteroaryl;

and (4) comprises:

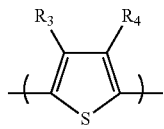

(5) comprises:

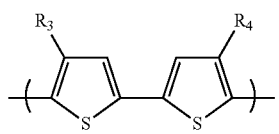

(6) comprises:

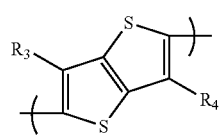

(7) comprises:

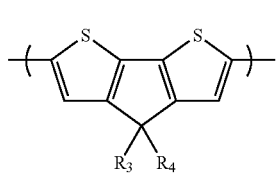

wherein R$_3$ and R$_4$=H or

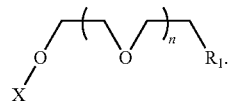

According to yet another aspect, the present invention provides a polymeric material comprising: a copolymer of a first monomer (8), (9) or (10); and a second monomer (11), (12), (13), (14), (15), (16), (17), (18), or (19);

wherein, (8) comprises:

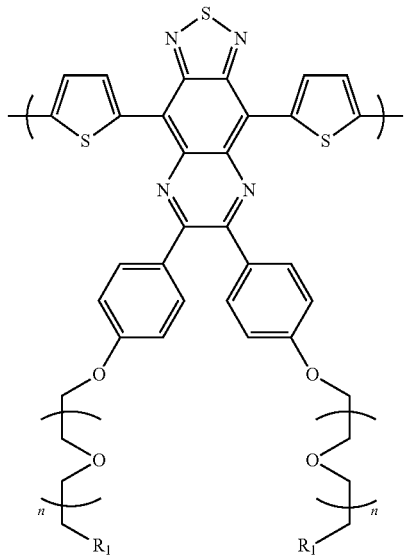

(9) comprises:

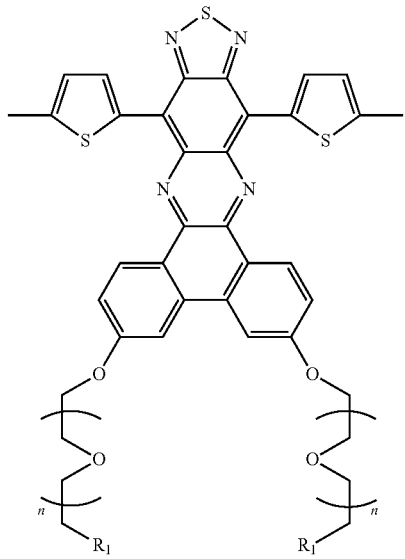

(10) comprises:

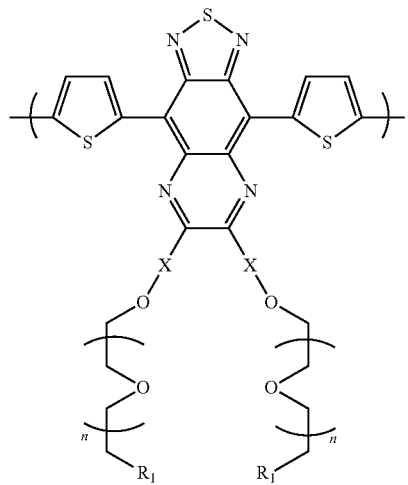

wherein $R_1$=OH, Br, I, Cl, SH, COOH, $NH_2$, $N(R_2)_3$ ($3R_2$ can be same or different), $SR_2$, $SR_2COOH$, $SR_2NH_2$, $SR_2SO_3H$, $SR_2SH$, $SR_2OH$, malemide, or NHS ester, X=$C_0$-$C_3$ alkyl, aryl, substituted aryl, heteroaryl, or substituted heteroaryl, and $R_2$=Alkyl, aryl, heteroaryl substituted aryl or substituted heteroaryl;

and

(11)
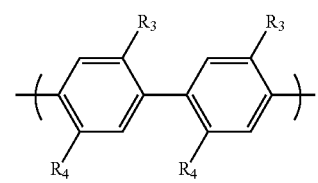

(12)
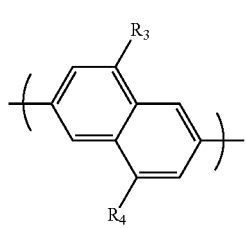

(13)
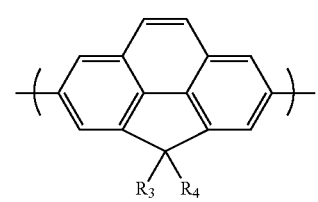

(14)
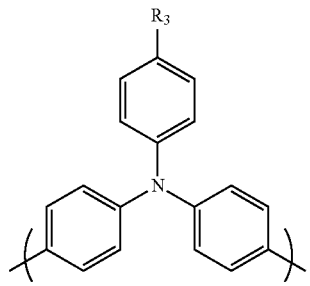

(15)
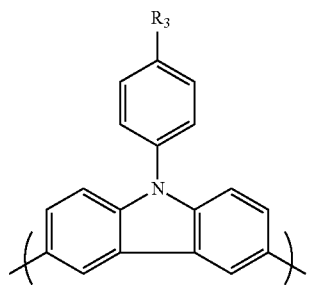

(16)
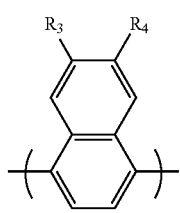

(17)
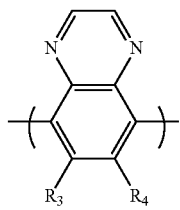

(18)
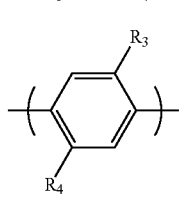

(19)
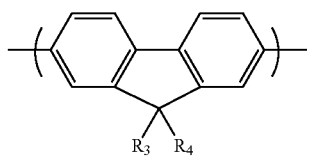

wherein $R_3$ and $R_4$=H or

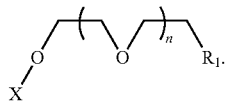

The present invention may address one or more of the problems and deficiencies of the prior art discussed above. However, it is contemplated that the invention may prove useful in addressing other problems and deficiencies, or provide benefits and advantages, in a number of technical areas. Therefore the claimed invention should not necessarily be construed as being limited to addressing any of the particular problems or deficiencies discussed herein.

BRIEF DESCRIPTION OF THE DRAWINGS

These and other feature of this invention will now be described with reference to the drawings of certain embodiments which are intended to illustrate and not to limit the invention.

DETAILED DESCRIPTION OF THE PREFERRED EMBODIMENTS

Further aspects, features and advantages of this invention will become apparent from the detailed description which follows.

Polymers or polymer precursors of the present invention can be composed or synthesized according to a number of alternatives. For example, polymers can be formed by co-polymerizing one of the monomers from Table 1 and one of the monomers from Table 2. Also, polymers can be formed by co-polymerizing one of the monomers from Table 1, one of the monomers from Table 2, and one of the monomers from Table 4. Polymer precursors can also be synthesized by co-polymerizing one of the monomers from Table 3, and one of the monomers from Table 2 and/or one of the monomers from Table 4. Alternatively, polymer precursors can be synthesized by self-polymerizing a monomer from Table 1, Table 2, Table 3 or Table 4.

TABLE 1

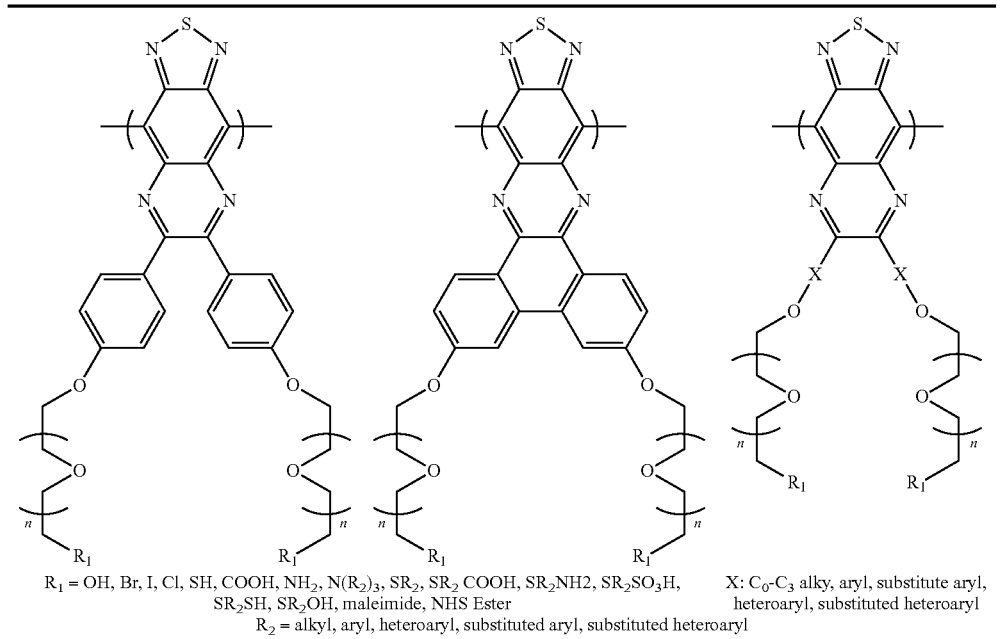

Figure 2:
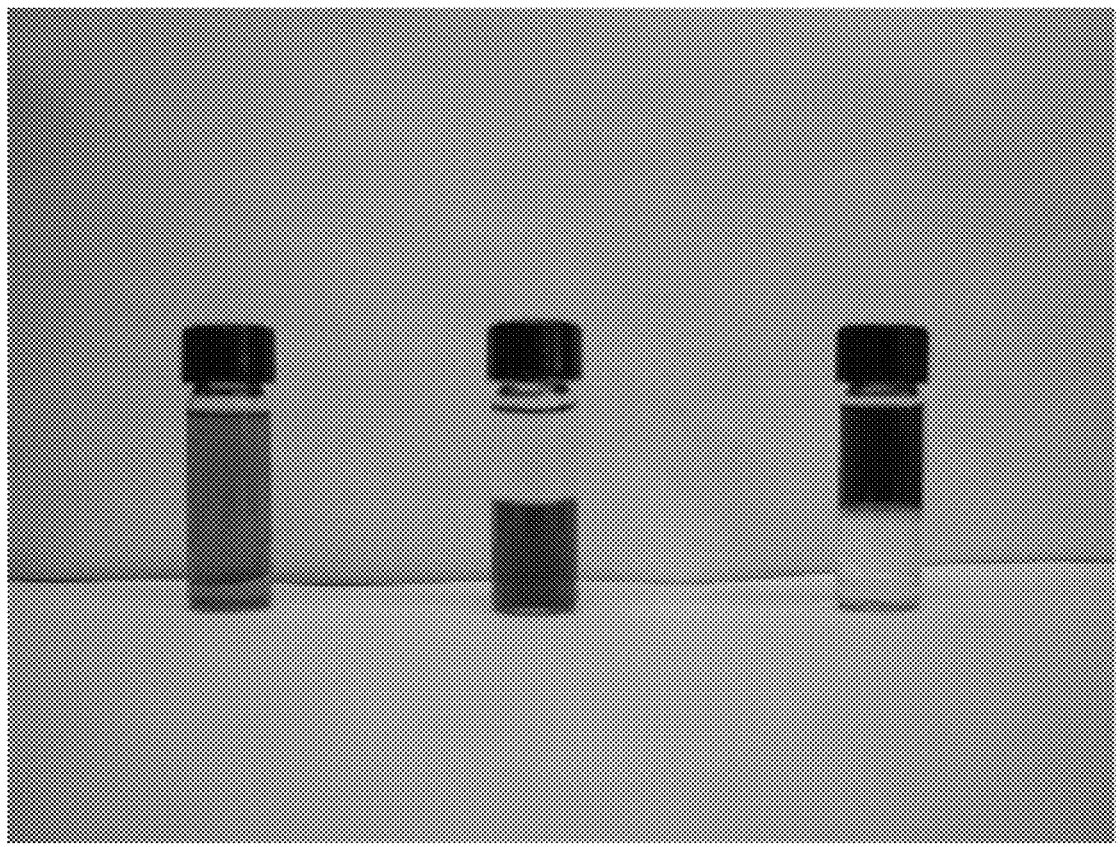

$R_1$ = OH, Br, I, Cl, SH, COOH, $NH_2$, $N(R_2)_3$, $SR_2$, $SR_2$ COOH, $SR_2NH2$, $SR_2SO_3H$, $SR_2SH$, $SR_2OH$, maleimide, NHS Ester
$R_2$ = alkyl, aryl, heteroaryl, substituted aryl, substituted heteroaryl
X: $C_0$-$C_3$ alky, aryl, substitute aryl, heteroaryl, substituted heteroaryl FIG. 2 illustrates the solubility of a polymeric material formed according to the principles of the present invention.

Figure 3:

FIG. 3 illustrates the solubility of another polymeric material formed according to the principles of the present invention.

Figure 4:
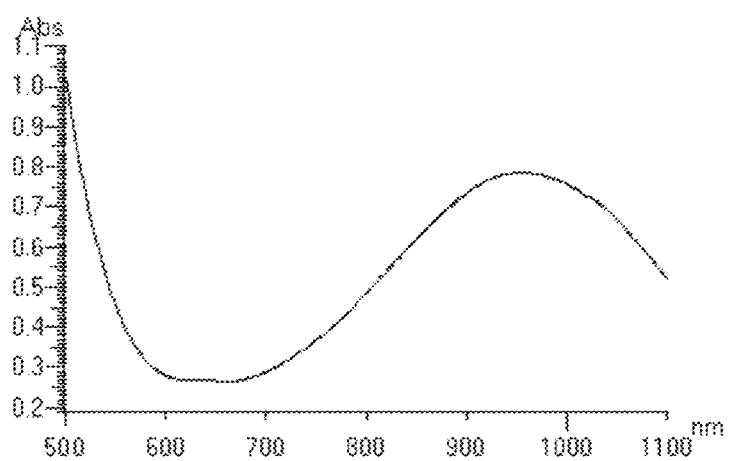

FIG. 4 shows the level of energy absorption at various wavelengths of a polymeric material formed according to the principles of the present invention.

Figure 5:
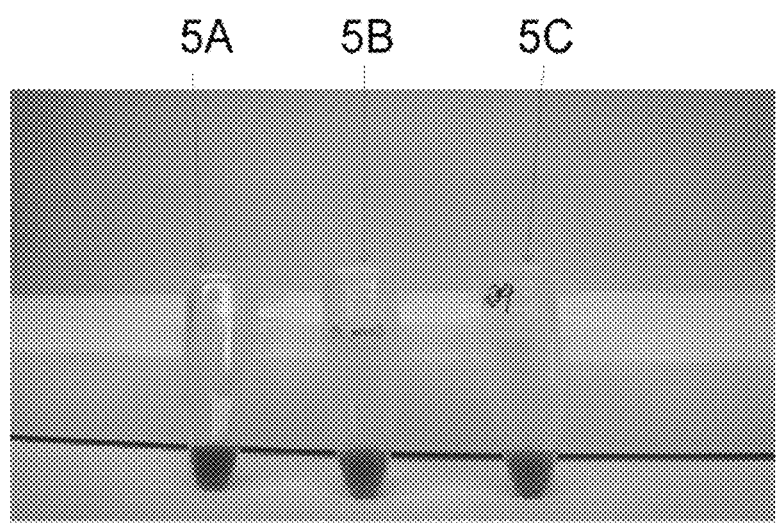

FIG. 5 shows the results of incubation of a polymeric material formed according to the principles of the present invention with magnetic beads.

Figure 6:
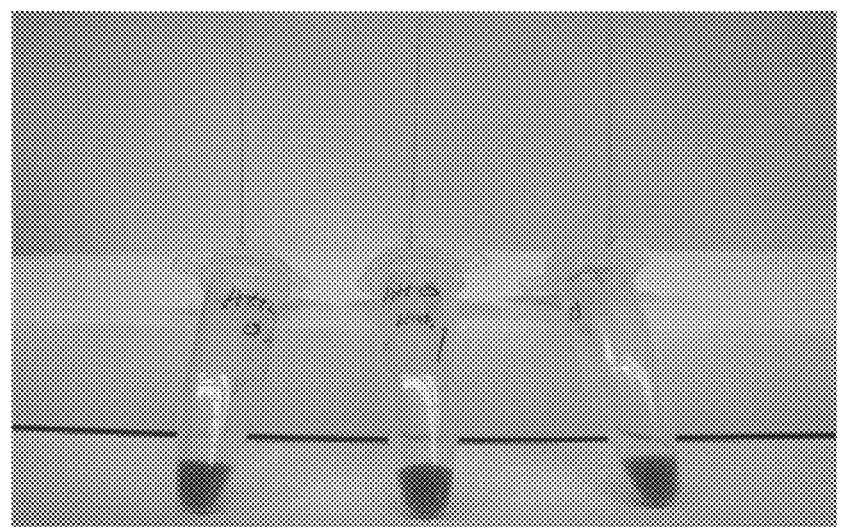

FIG. 6 shows the results of incubation of a comparative material with magnetic beads.

Figure 7:
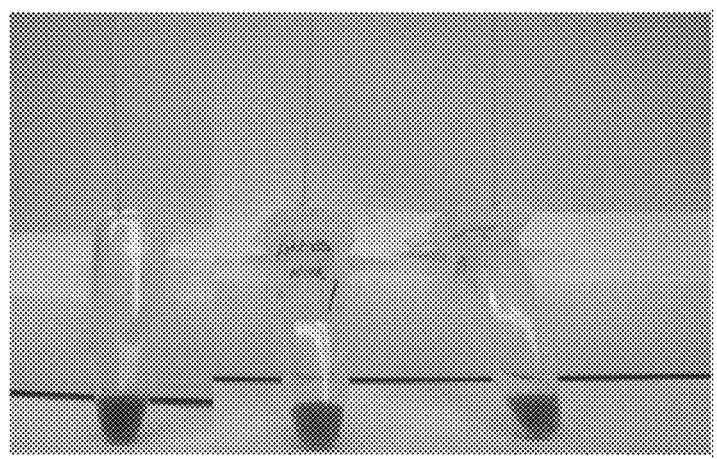

FIG. 7 shows the combined results of incubation of a material formed according to the principles of the present invention and incubation of a comparative polymeric material with magnetic beads.

TABLE 2

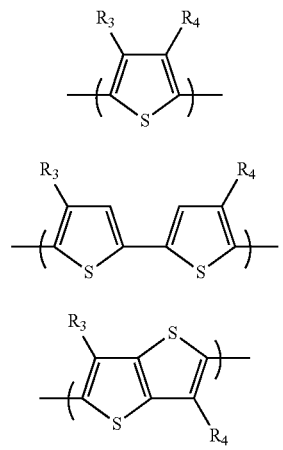

TABLE 2-continued
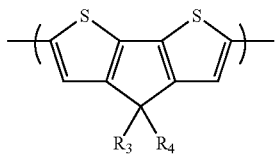
R₃ and R₄: H or $X{-}O{-}(CH_2CH_2O)_n{-}R_1$
TABLE 3
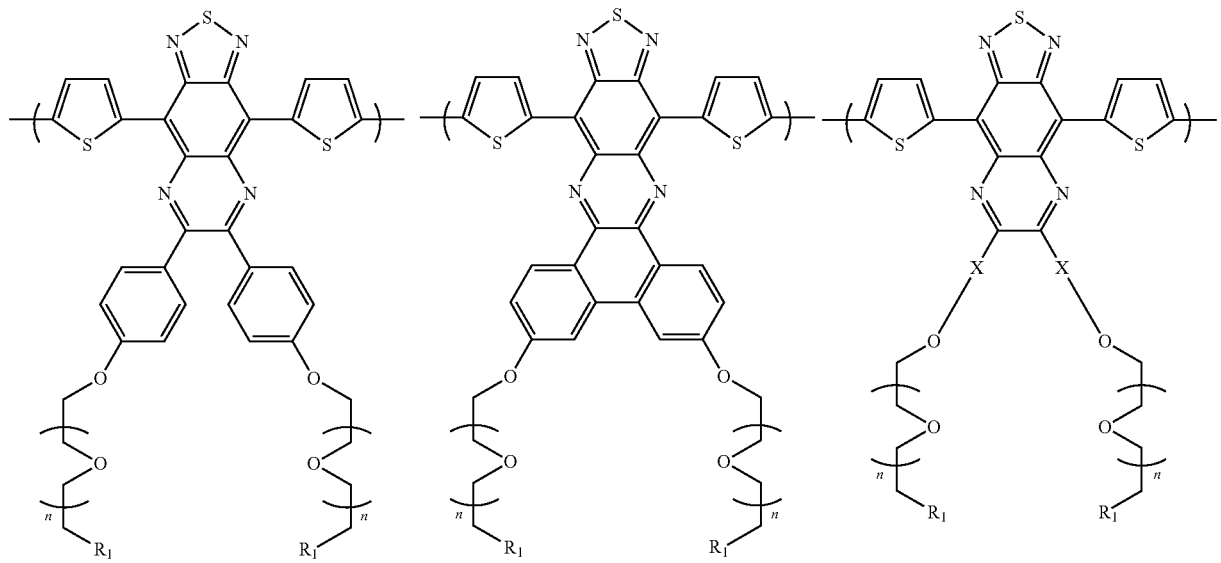
$R_1$ = OH, Br, I, Cl, SH, COOH, NH₂, N(R₂)₃, SR₂, SR₂COOH, SR₂NH2, SR₂SO₃H, SR₂SH, SR₂OH, maleimide, NHS Ester
$R_2$ = alky, aryl, heteroaryl, substituted aryl, substituted heteroaryl
X: C₀-C₃ alkyl, aryl, substituted aryl, heteroaryl, substituted heteroaryl
TABLE 4
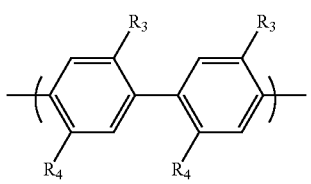
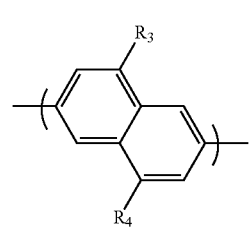
TABLE 4-continued
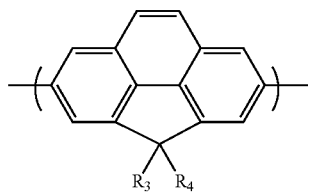
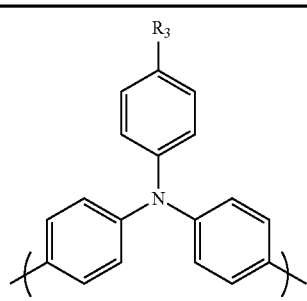
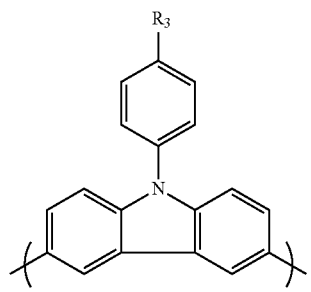

TABLE 4-continued

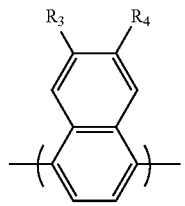

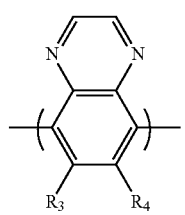

TABLE 4-continued

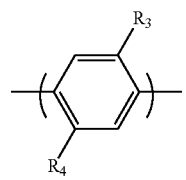

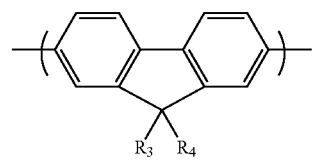

R$_3$ and R$_4$: H or 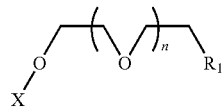

The polymer precursors described above can be functionalized by attaching any suitable functional units such as bio-molecules to its reactive sites. The polymer is ether soluble in water in its precursor state or after functionalization. Examples of suitable bio-molecules for functionalization may include, without limitation, carbohydrates, proteins, peptides, DNA, RNA, antibodies, antigens, enzymes, bacterias, redox molecules, host molecules, guest molecules, haptens, lipids, microbes, aptamers, sugars or the like. Some specific examples of polymer precursors and functionalized polymers with suitable bio-molecules are shown in Table 5.

TABLE 5

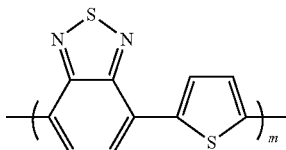
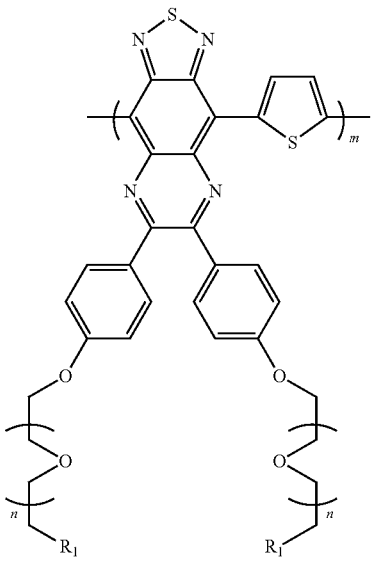

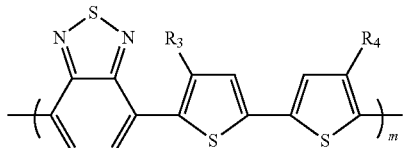
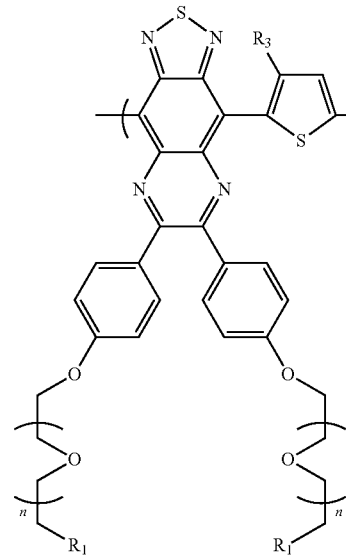

TABLE 5-continued
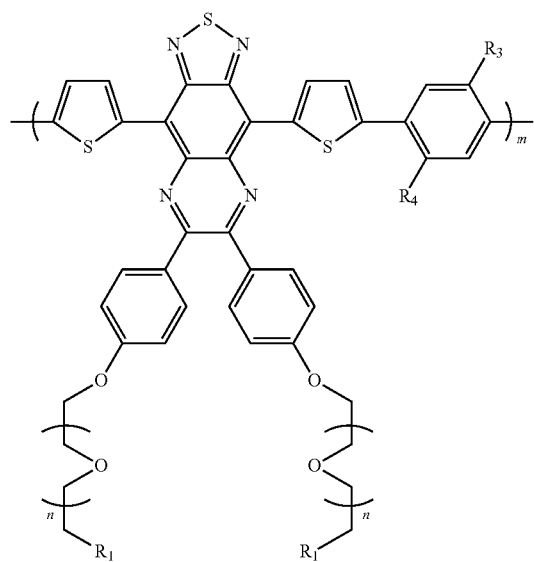
$R_1$ = OH, Br, I, Cl, SH, COOH, $NH_2$, $N(R_2)_3$, $SR_2$, $SR_2COOH$, $SR_2NH2$, $SR_2SO_3H$, $SR_2SH$, $SR_2OH$, maleimide, NHS Ester
$R_2$ = alkyl, aryl, heteroaryl, substituted aryl, substituted heteroaryl
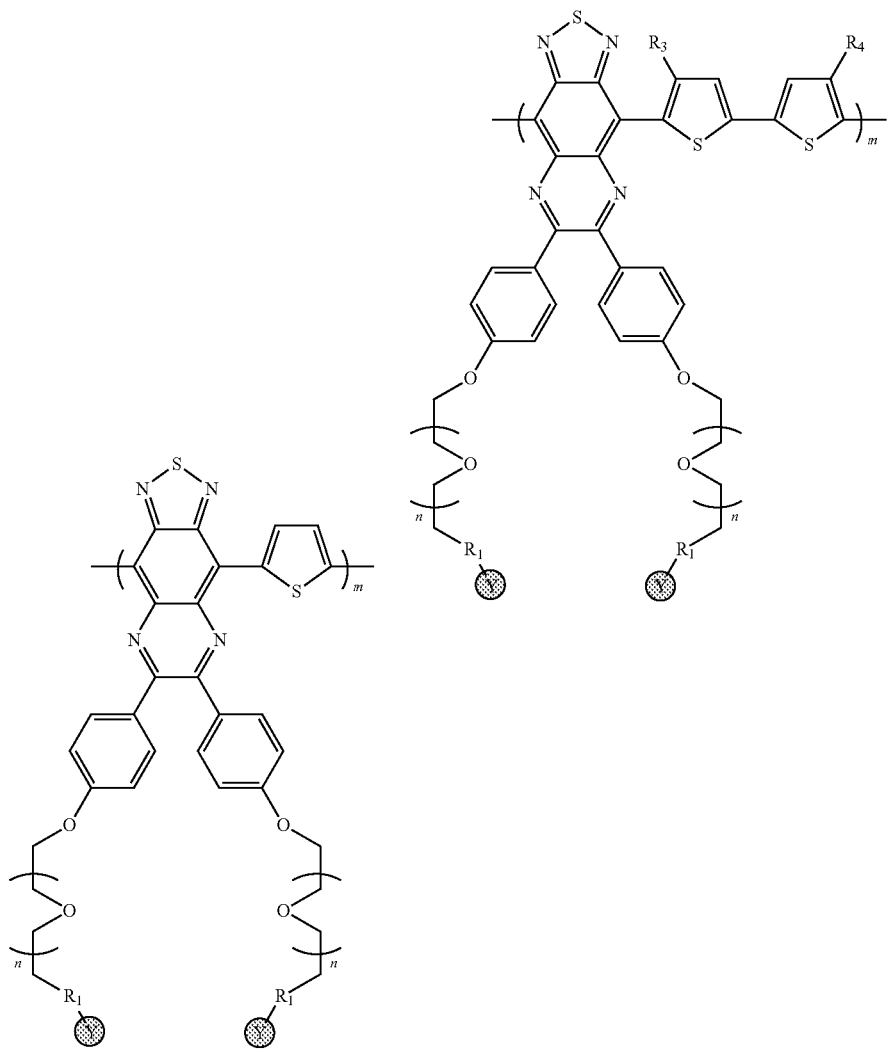

TABLE 5-continued

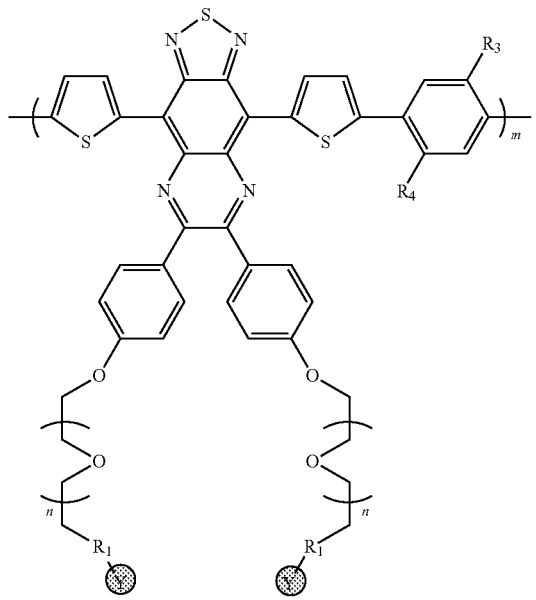

◉ = Bio-molecules such as carbohydrates, proteins, peptides, DNAs, antibody, antigen, enzyme, bacteria, etc.

The wavelength of energy absorbed by the polymers is about 700-1100 nm or above about 1100 nm, and the absorption can be adjusted by adjusting the degree of polymerization. The band gaps of the polymers are generally between about 0.8 eV and about 1.7 eV. In a number of cases, the band gaps are between about 1.1 eV and about 1.4 eV.

The concepts of the present invention will now be further described by reference to the following non-limiting examples of specific polymers and exemplary techniques for their formation. It should be understood that additional polymers and additional techniques of formation are also comprehended by the present invention.

Example 1

Synthesis of Polymer 1

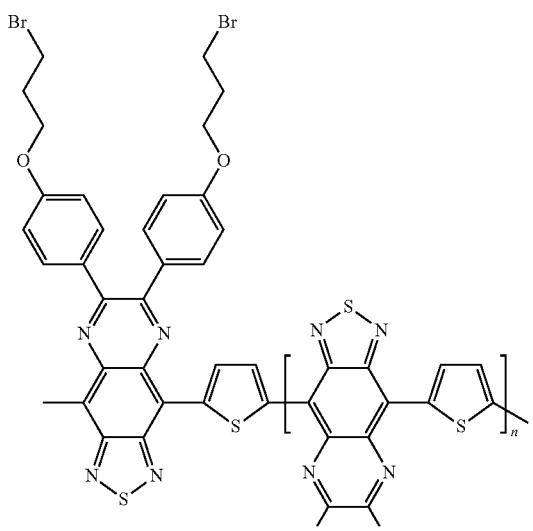

-continued

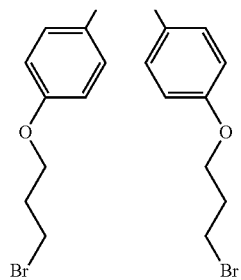

Polymer 1

Scheme 1 below illustrates the synthesis of 4,7-dibromo-5,6-diamine-benzo[1,2,5]thiadiazole 4 starting from benzo[1,2,5]thiadiazole.

Scheme 1

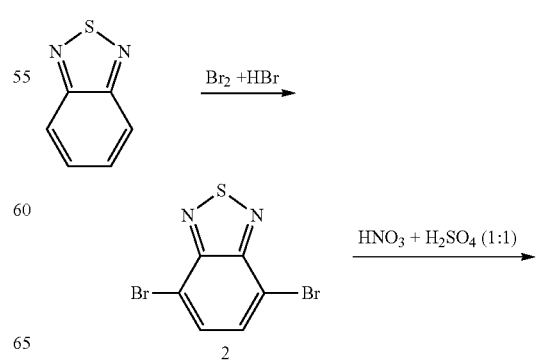

-continued

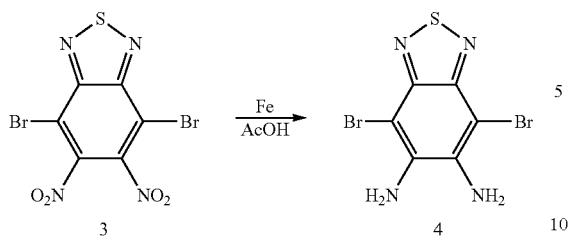

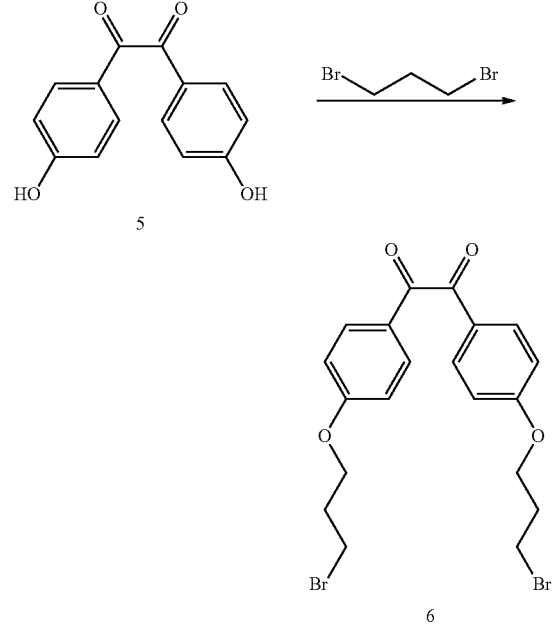

Benzothiadiazole (10.0 g, 73.4 mmol) and HBr (150 mL, 48%) were added to a 500 mL three-necked round-bottomed flask. A solution containing $Br_2$ (35.2 g, 220.3 mmol) in HBr (100 mL) was added dropwise very slowly. After the total addition of $Br_2$, the solution was heated at reflux for overnight. Precipitation of a dark orange solid was noted. The mixture was cooled to room temperature, and a sufficient amount of a saturated solution of $NaHSO_3$ was added to completely consume any excess $Br_2$. The mixture was filtered under vacuum and washed exhaustively with water and dried under vacuum to yield the dibrominated product 2, as confirmed by the following nuclear magnetic resonance (NMR) data obtained therefrom: $^1H$ NMR (500 MHz, CDCl3): δ 7.75 (s, 2H) ppm 4,7-dibromobenzo[1,2,5]thiadiazole 2 (409, 137 mmol) was added to a mixture of fuming sulphuric acid (200 ml) and fuming nitric acid (200 ml) in small portions at 0° C. and then the reaction mixture was stirred at room temperature for 72 hrs. After 72 hrs, the mixture was poured into ice-water, the solid was filtered and washed with water several times, then recrystallized in ethanol to give compound 3 as a pale yellow solid.

A mixture of 4,7-dibromo-5,6-dinitro-benzo[1,2,5]thiadiazole 3 (10 g, 26 mmol) and fine iron powder (10 g, 178 mmol) in acetic acid was stirred at 80° C. until compound 3 completely disappeared monitored by thin layer chromatography (TLC). The reaction mixture was cooled down to room temperature and then precipitated in 5% solution of NaOH. The solid was filtered and washed with water several times. Obtained filter cake was dissolved in hot ethyl acetate (EtOAc) and then filtered to remove unreacted iron, the filtrate was evaporated to remove solvent on a rotary evaporator to give 4,7-dibromo-5,6-diamine-benzo[1,2,5]thiadiazole 4 as a yellow solid, as confirmed by the following nuclear magnetic resonance (NMR) data obtained therefrom: $^1H$ NMR (500 MHz, DMSO): δ 3.31 (s, 4H) ppm.

Scheme 2 below shows the synthesis of 1,2-bis(4-(3-bromopropoxy)-phenyl)ethane-1,2-dione 6 starting from 1,2-bis(4-methoxyphenyl)ethane-1,2-dione.

Scheme 2

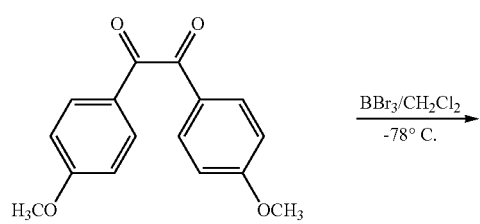

1,2-bis(4-methoxyphenyl)ethane-1,2-dione (5 g, 18.52 mmol) was dissolved in $CH_2Cl_2$ and cooled to −78° C. (solid occurred again). $BBr_3$ (8.3 m, 87.82 mmol) was added and mixture was allowed to warm to room temperature and stirred for 15 hrs. TLC check showed 1,2-bis(4-methoxyphenyl) ethane-1,2-dione completely disappeared. The reaction mixture was poured into ice, extracted by EtOAc, washed with NaCl solution, dried over $MgSO_4$. The solvent was removed by vacuum, and the residue was purified by column chromatography to give compound 5, 1,2-bis(4-hydroxyphenyl) ethane-1,2-dione, as confirmed by the following nuclear magnetic resonance (NMR) data obtained therefrom: $^1H$ NMR (500 MHz, DMSO): δ 10.8 (s, 2H), 7.71 (d, J=8.8 MHz, 4H), 6.90 (d, J=8.8 MHz, 4H) ppm.

1,2-bis(4-hydroxyphenyl)ethane-1,2-dione (2.6 g, 10.74 mmol) was dissolved in DMF and $K_2CO_3$ (5.9 g, 42.7 mmol) was added, 100 mmol of 1,3-dibromopropane and a catalytic amount of KI were then added. The mixture was heated to 80° C. and stirred for 3 days. TLC check showed 1,2-bis(4-hydroxyphenyl)ethane-1,2-dione disappeared. Dimethylformamide (DMF) was removed, and water was added, extracted by EtOAc, washed with brine, dried over $MgSO_4$. The solvent was removed and the residue was purified by column chromatography to give 1,2-bis(4-(3-bromopropoxy)phenyl) ethane-1,2-dione 6 as a pale yellow solid, as confirmed by the following nuclear magnetic resonance (NMR) data obtained therefrom: $^1H$ NMR (500 MHz, CDCl$_3$): δ 7.94 (d, J=8.8 MHz, 4H), 6.99 (d, J=8.8 MHz, 4H), 4.20 (t, J=6.2 MHz, 4H), 3.61 (t, J=6.2 MHz, 4H), 2.34 (m, 4H) ppm.

Scheme 3 below shows the synthesis of Monomer 1, 4,9-dibromo-6,7-bis(4-(3-bromopropoxy)phenyl)-[1,2,5]thiadiazolo[3,4-g]quinoxaline.

Scheme 3

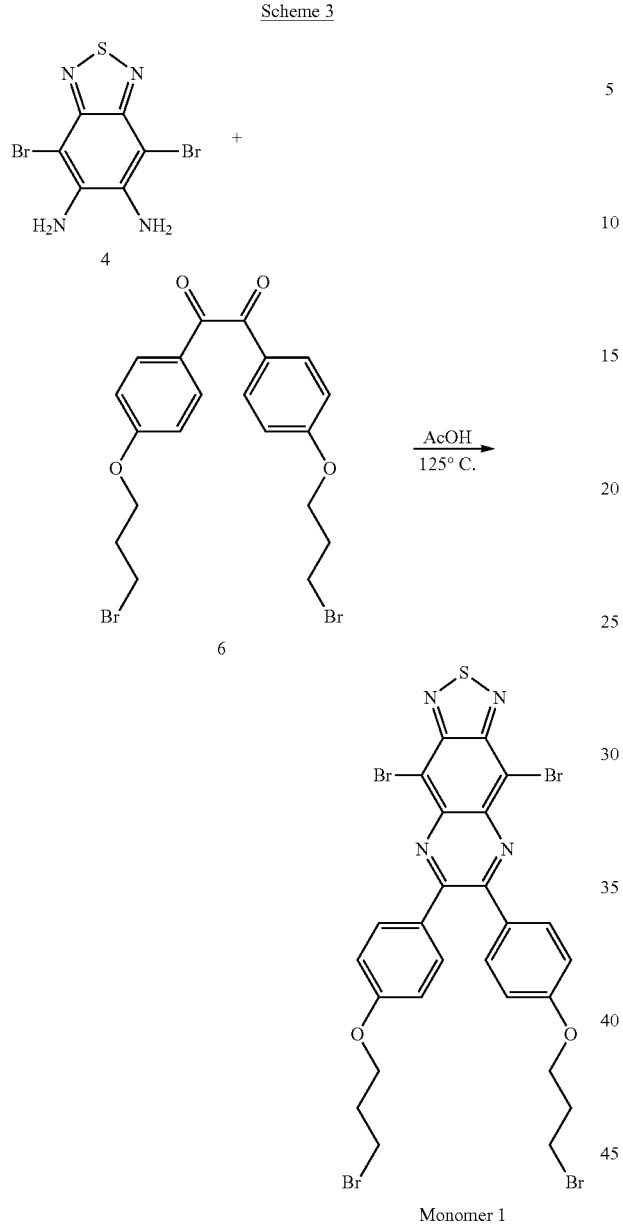

4,7-dibromo-5,6-diamine-benzo[1,2,5]thiadiazole 4 (0.6 g, 1.23 mmol) and 1,2-bis(4-(3-bromopropoxy)phenyl)ethane-1,2-dione 6 (0.4 g, 1.23 mmol) were placed in a reaction flask, and AcOH was added. The reaction mixture was heated to 125° C. and stirred for 3.5 hrs. TLC check showed both compound 4 and 6 disappeared. The mixture was cooled down to room temperature and poured into water, and then extracted by EtOAc, washed with brine, dried over MgSO$_4$. The residue was purified by column chromatography to give Monomer 1, 4,9-dibromo-6,7-bis(4-(3-bromopropoxy)phenyl)-[1,2,5]thiadiazolo[3,4-g]quinoxaline as a orange solid, as confirmed by the following nuclear magnetic resonance (NMR) data obtained therefrom: $^1$H NMR (500 MHz, CDCl$_3$): δ 7.77 (d, J=8.8 MHz, 4H), 6.95 (d, J=8.8 MHz, 4H), 4.19 (t, J=6.2 MHz, 4H), 3.64 (t, J=6.3 MHz, 4H), 2.37 (m, 4H) ppm.

Scheme 4 below shows the co-polymerization of Monomer 1 and thiophene-2,5-diboronic acid to produce Polymer 1.

Scheme 4

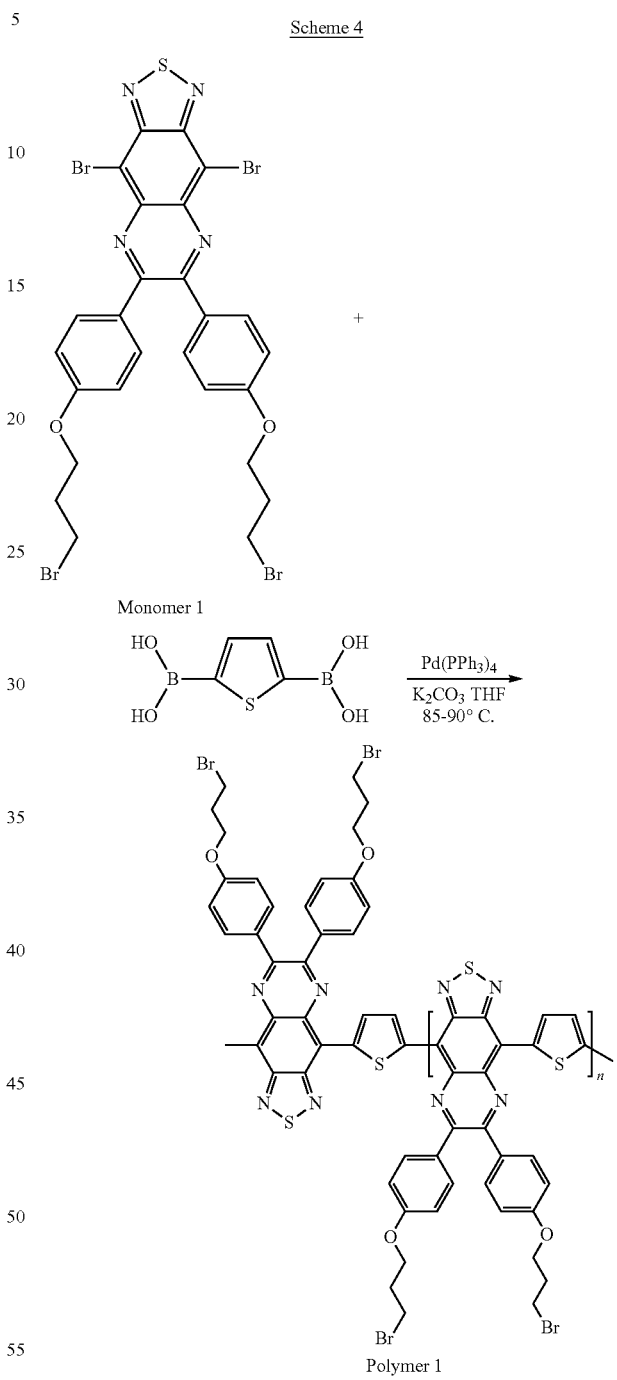

0.2 mmol of Monomer 1 and 0.2 mmol of 2,5-thiophene-diboronic acid, Pd(PPh$_3$)$_4$ (8 mg), K$_2$CO$_3$ (0.25 g) were placed in three-neck flask and degassed, and then refilled with N$_2$. 20 ml of tetrahydrofuran (THF) and 8 ml of water were added, and reaction mixture was heated to 85° C., stirred for 24 hrs. The reaction was cooled down to room temperature and poured into CH$_3$OH. Collected Polymer 1 was washed with CH$_3$OH several times and dried by vacuum to give a dark solid.

Figure 1:
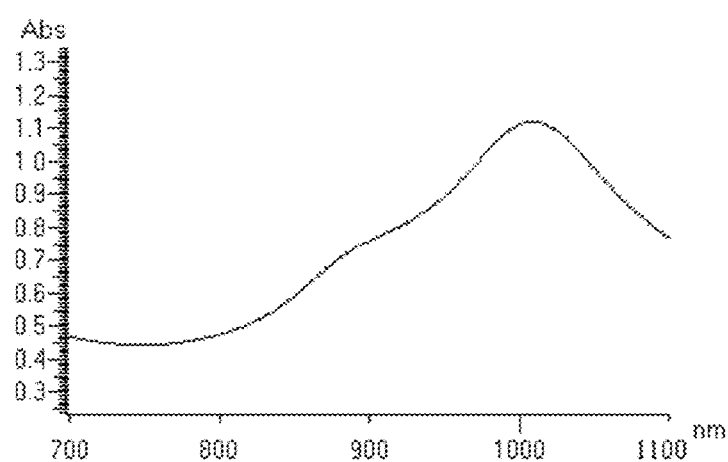
FIG. 1 shows the level of energy absorption at various wavelengths of a polymeric material formed according to the principles of the present invention.

Absorption of Polymer 1 was measured and the spectrum is shown in FIG. 1. Maximum wavelength absorption of energy by the Polymer 1 can reach 1008 nm.

Example 2

Synthesis of Polymer 2 and Water-Soluble Glucose-Functionalized Polymer 2

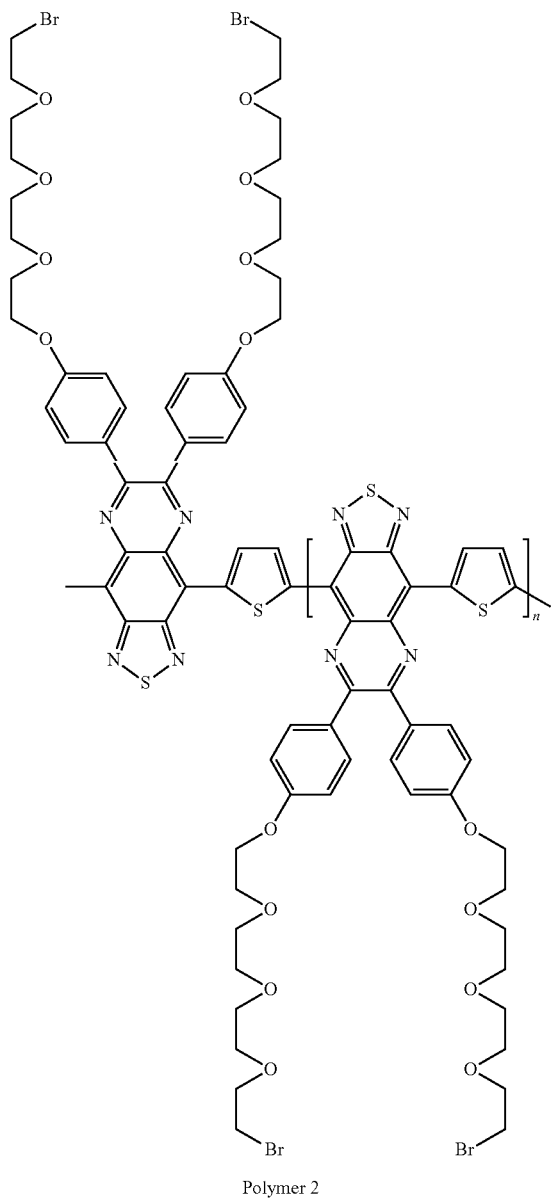

Polymer 2

Scheme 5 shows the synthesis of compound 7, 1,2-bis(4-(2-(2-(2-(2-bromoethoxy)ethoxy)ethoxy)ethoxy)phenyl)ethane-1,2-dione.

Scheme 5

1,2-bis(4-hydroxyphenyl)ethane-1,2-dione (2.6 g, 10.74 mmol) was dissolved in acetone and $K_2CO_3$ (5.9 g, 42.7 mmol) was added, then 80 mmol of 1-bromo-2-(2-(2-(2-bromoethoxy)ethoxy)ethoxy)ethane was added. The mixture was heated to 80° C. and stirred for 24 hrs. A TLC check showed 1,2-bis(4-hydroxyphenyl)ethane-1,2-dione disappeared. Acetone was removed, and water was added, extracted by EtOAc, washed with brine, dried over $MgSO_4$. The solvent was removed and residue was purified by column chromatography to give 1,2-bis(4-(2-(2-(2-(2-bromoethoxy)ethoxy)ethoxy)ethoxy)phenyl)ethane-1,2-dione 7 as a pale yellow oil, as confirmed by the following nuclear magnetic resonance (NMR) data obtained therefrom: $^1H$ NMR (500 MHz, $CDCl_3$): δ 7.94 (d, J=8.8 MHz, 4H), 6.99 (d, J=8.8 MHz, 4H), 4.21 (t, J=4.8 MHz, 4H), 3.88 (t, J=4.8 MHz, 4H), 3.80 (t, J=6.3 MHz, 4H), 3.78-3.66 (m, 16H), 3.46 (t, J=6.3 MHz, 4H) ppm.

Scheme 6 below shows the synthesis of Monomer 2, 4,9-dibromo-6,7-bis(4-(2-(2-(2-(2-bromoethoxy)ethoxy)ethoxy)phenyl)-[1,2,5]thiadiazolo[3,4-q]quinoxaline.

Scheme 6

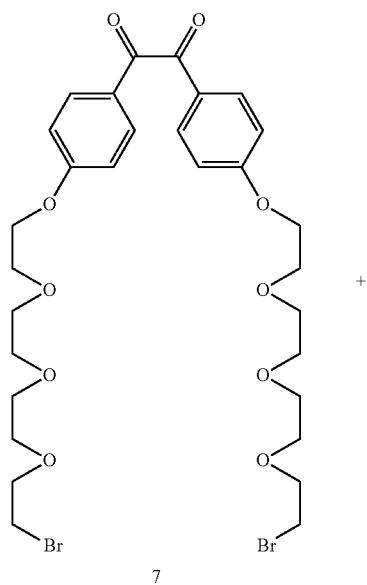

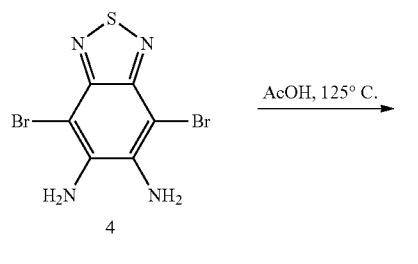

4,7-dibromo-5,6-diamine-benzo[1,2,5]thiadiazole 4 (0.6 g, 1.23 mmol) and 1,2-bis(4-(2-(2-(2-(2-bromoethoxy)ethoxy)ethoxy)ethoxy)phenyl)ethane-1,2-dione 7 (0.89 g, 1.23 mmol) were placed in a reaction flask, and AcOH was added. The reaction mixture was heated to 125° C. and stirred for 3.5 hrs. A TLC check showed both compound 4 and 7 disappeared. The mixture was cooled down to room temperature and poured into water, and then extracted by EtOAc, washed with brine, dried over $MgSO_4$. The residue was purified by column chromatography to give Monomer 2, 4,9-dibromo-6,7-bis(4-(2-(2-(2-(2-bromoethoxy)ethoxy)ethoxy)ethoxy)-phenyl)-[1,2,5]thiadiazolo[3,4-g]quinoxaline as an orange sticky oil, as confirmed by the following nuclear magnetic resonance (NMR) data obtained therefrom: $^1$H NMR (500 MHz, $CDCl_3$): δ 7.75 (d, J=8.8 MHz, 4H), 6.94 (d, J=8.8 MHz, 4H), 4.20 (t, J=4.8 MHz, 4H), 3.90 (t, J=4.8 MHz, 4H), 3.82 (t, J=6.3 MHz, 4H), 3.76-3.69 (m, 16H), 3.47 (t, J=6.3 MHz, 4H) ppm.

Scheme 7 below shows the co-polymerization of Monomer 2 and thiophene-2,5-diboronic acid to produce Polymer 2.

Scheme 7

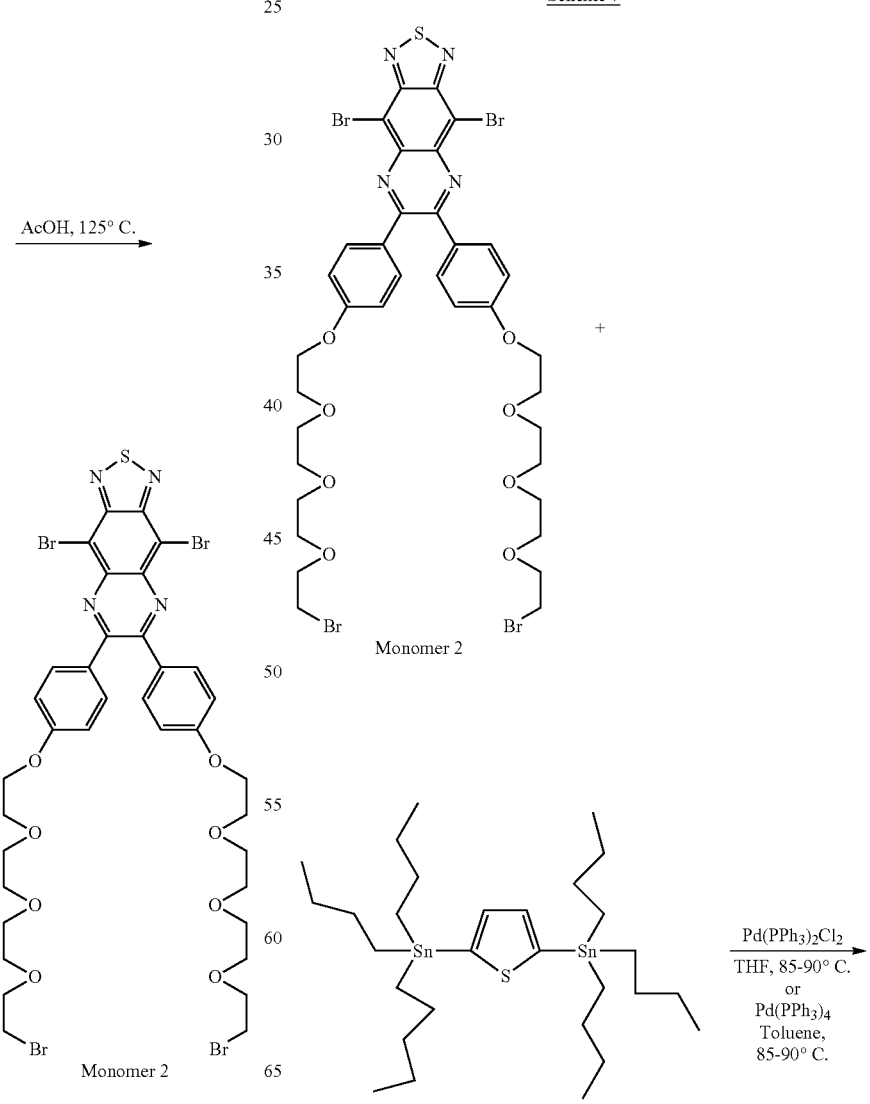

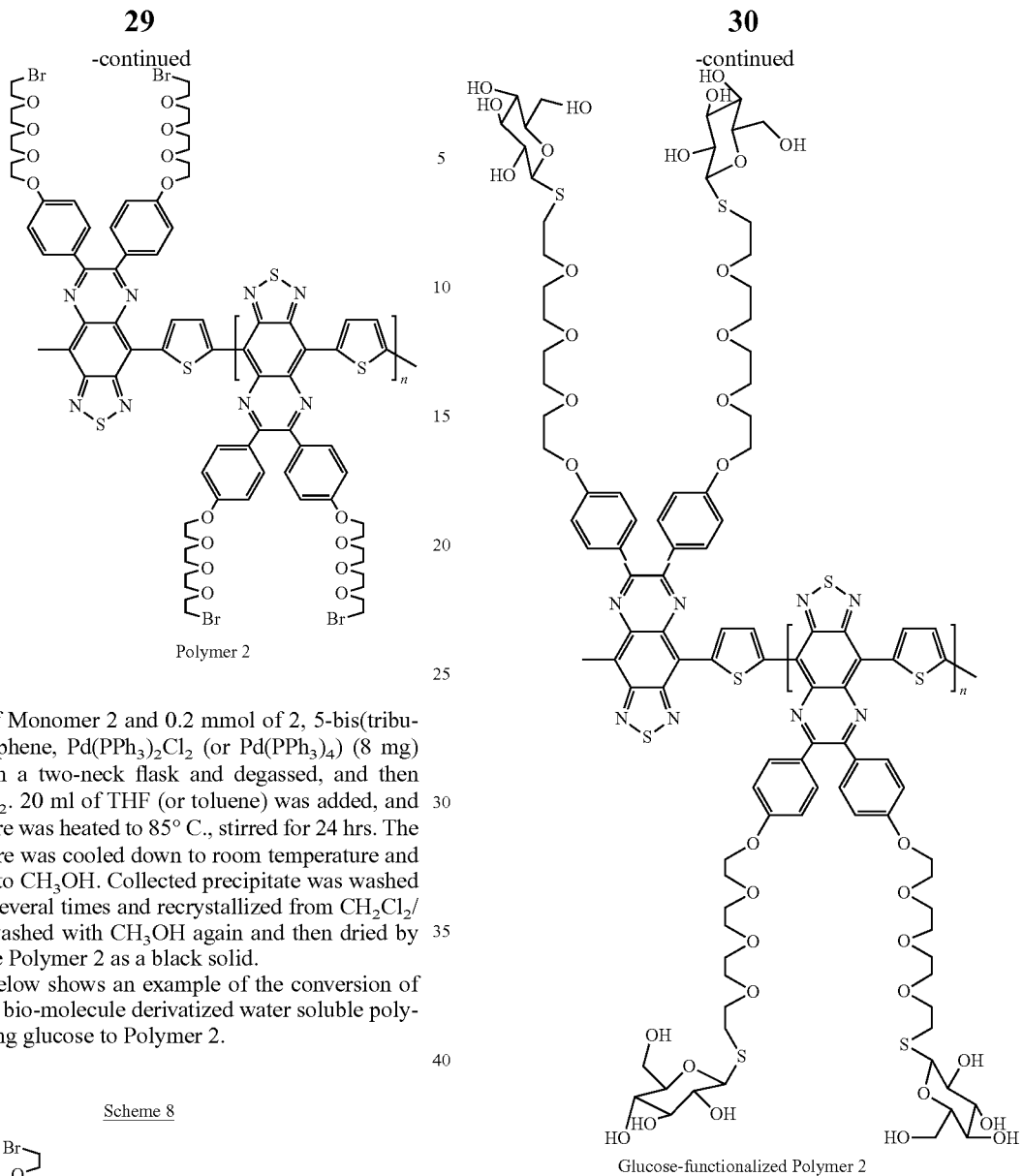

Polymer 2

0.2 mmol of Monomer 2 and 0.2 mmol of 2, 5-bis(tributylstannyl)thiophene, Pd(PPh$_3$)$_2$Cl$_2$ (or Pd(PPh$_3$)$_4$) (8 mg) were placed in a two-neck flask and degassed, and then refilled with N$_2$. 20 ml of THF (or toluene) was added, and reaction mixture was heated to 85° C., stirred for 24 hrs. The reaction mixture was cooled down to room temperature and then poured into CH$_3$OH. Collected precipitate was washed with CH$_3$OH several times and recrystallized from CH$_2$Cl$_2$/CH$_3$OH and washed with CH$_3$OH again and then dried by vacuum to give Polymer 2 as a black solid.

Scheme 8 below shows an example of the conversion of Polymer 2 to a bio-molecule derivatized water soluble polymer by attaching glucose to Polymer 2.

Scheme 8

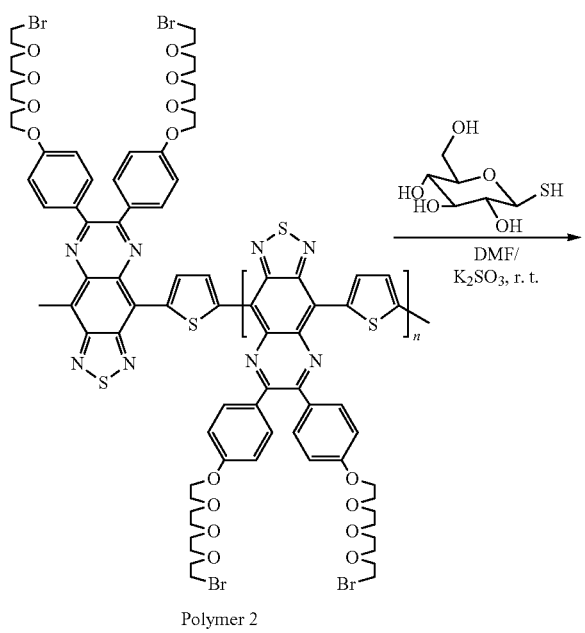

Polymer 2

Glucose-functionalized Polymer 2

0.2 g of Polymer 2 was dissolved in 8 ml of DMF in 25 mL single-neck round bottom flask. 0.2 g of 1-thio-β-D-glucose was added, following by 0.5 g of anhydrous K$_2$CO$_3$. The reaction mixture was stirred at room temperature for 30 hrs, and then transferred into a dialysis tube for dialysis against water for 2 days (8 water changes). The solution obtained in dialysis tube was then transferred into a single-neck round bottom flask. After removal of water, Glucose-functionalized Polymer 2 was obtained as a black solid.

Glucose-functionalized Polymer 2 has very good water solubility as shown in FIG. 2. Shown on the left is Monomer 2 in CH$_2$Cl$_2$ solution. Shown in the middle is an upper layer of water and a lower layer of Polymer 2 in CH$_2$Cl$_2$ solution. Shown on the right is an upper layer of Glucose-functionalized Polymer 2 in water solution and a lower layer of CH$_2$Cl$_2$.

Example 3

Synthesis of Polymer 3

Scheme 9 below shows the co-polymerization of Monomer 3 and thiophene-2,5-diboronic acid to produce Polymer 3.

Scheme 9

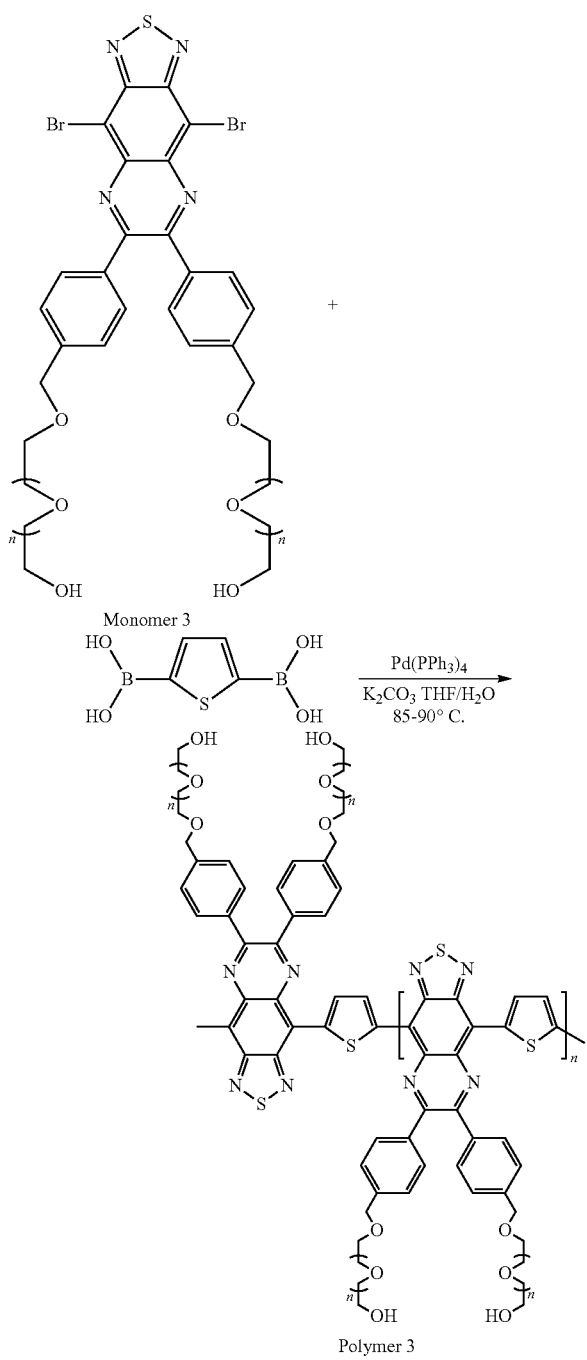

0.15 mmol of monomer 3 and 0.15 mmol of 2,5-thiophene-diboronic acid, Pd(PPh₃)₄ (8 mg). K₂CO₃ (0.25 g) were placed in two-neck flask and degassed, and then refilled with N₂. 10 ml of THF and 5 ml of water were added, and reaction mixture was heated to 85° C., stirred for 24 hrs. The reaction mixture was cooled down to room temperature and the water phase was extracted and transferred into a dialysis tube for dialysis against water for 2 days. Then, the water solution in the dialysis tube was transferred into a single-neck round bottom flask, and the water was removed to give Polymer 3 as a dark solid. Polymer 3 has very good water solubility.

Example 4

Synthesis of Polymer 4

Scheme 10 below illustrates the synthesis of Monomer 4, 6,7-bis(4-(2-(2-(2-(2-bromoethoxy)ethoxy)ethoxy)ethoxy)phenyl)-4,9-bis(5-bromothiophen-2-yl)-[1,2,5]thiadiazolo[3,4-g]quinoxaline, starting from Monomer 2.

Scheme 10

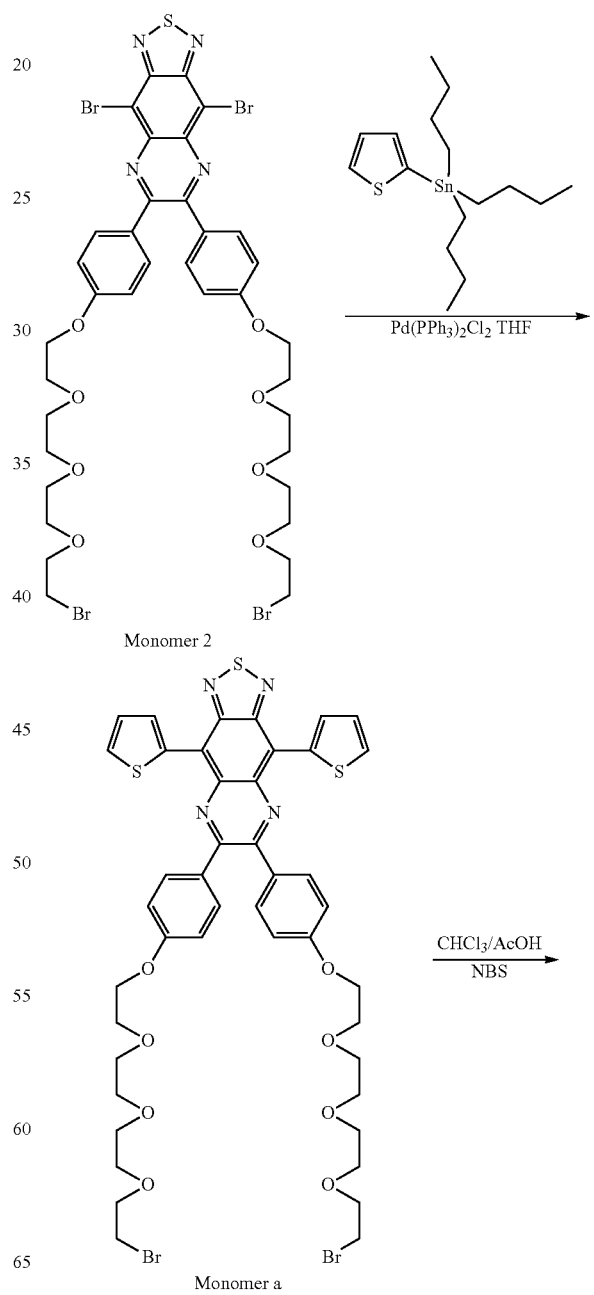

-continued

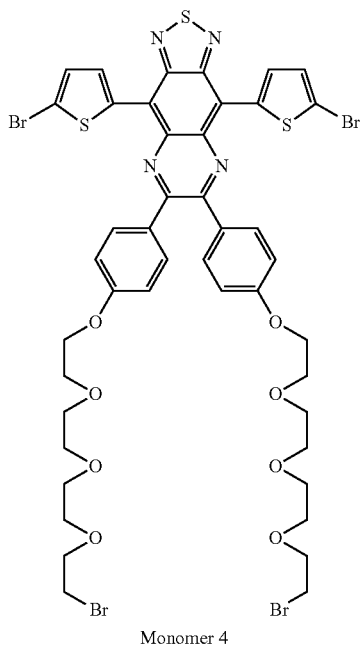 [SMILES: BrCCOCCOCCOCCOc1ccc(-c2nc3c(-c4ccc(Br)s4)c4nsnc4c(-c4ccc(Br)s4)c3nc2-c2ccc(OCCOCCOCCOCCBr)cc2)cc1]

Monomer 4

2.0 g (1.98 mmol) of Monomer 2 and 40 mg of dichlorobis(triphenylphosphine) palladium were placed in a 50 mL two-neck round bottom flask, degassed and refilled with $N_2$. Anhydrous THF was added following by 2-(tribytylstannyl)thiophene (2.3 g, 4.96 mmol). The mixture was heated to reflux. After stirring 4 hrs, the reaction mixture was cooled down to room temperature and poured into water, extracted with EtOAc. Combined EtOAc layer was washed with water and dried over anhydrous $MgSO_4$. The solvent was removed and the residue was purified by chromatography to give Monomer a, 6,7-bis(4-(2-(2-(2-(2-bromoethoxy)ethoxy)ethoxy)ethoxy)phenyl)-4,9-di(thiophen-2-yl)-[1,2,5]thiadiazolo[3,4-g]quinoxaline as a dark blue sticky oil, as confirmed by the following nuclear magnetic resonance (NMR) data obtained therefrom: $^1$H NMR (500 MHz, CDCl$_3$): δ 9.01 (d, J=4.0 MHz, 2H), 7.81 (d, J=8.8 MHz, 4H), 7.71 (d, J=5.0 MHz, 2H), 7.34 (m, 2H), 6.98 (d, J=8.8 MHz, 4H), 4.23 (t, J=4.8 MHz, 4H), 3.94 (t, J=4.8 MHz, 4H), 3.85 (t, J=6.3 MHz, 4H), 3.80-3.72 (m, 16H), 3.49 (t, J=6.3 MHz, 4H) ppm.

Monomer a (1.2 g, 1.19 mmol) was dissolved in a 1:1 mixture of chloroform and acetic acid and N-bromosuccinimide (0.43 g, 2.42 mmol) was added. The reaction mixture was stirred in darkness at room temperature for 3 hrs. A TLC check indicated complete reaction, and the mixture was poured into water and extracted with EtOAc. The combined organic layer was washed with brine solution and dried over anhydrous $MgSO_4$. After removal of solvent, the residue was purified by chromatography to afford Monomer 4, 6,7-bis(4-(2-(2-(2-(2-bromoethoxy)ethoxy)ethoxy)ethoxy)phenyl)-4,9-bis(5-bromothiophen-2-yl)-[1,2,5]thiadiazolo[3,4]quinoxaline, as a dark sticky oil, as confirmed by the following nuclear magnetic resonance (NMR) data obtained therefrom: $^1$H NMR (500 MHz, CDCl$_3$): δ 8.98 (d, J=4.0 MHz, 2H), 7.74 (d, J=8.8 MHz, 4H), 7.25 (m, 2H), 6.99 (d, J=8.8 MHz, 4H), 4.24 (t, J=4.8 MHz, 4H), 3.94 (t, J=4.8 MHz, 4H), 3.82 (t, J=6.3 MHz, 4H), 3.78-3.71 (m, 16H), 3.47 (t, J=6.3 MHz, 4H) ppm.

Monomer 4 also can be synthesized by other different routes.

Scheme 11 below shows the co-polymerization of Monomer 4 and 1,4-phenylenediboronic acid to produce Polymer 4.

Scheme 11

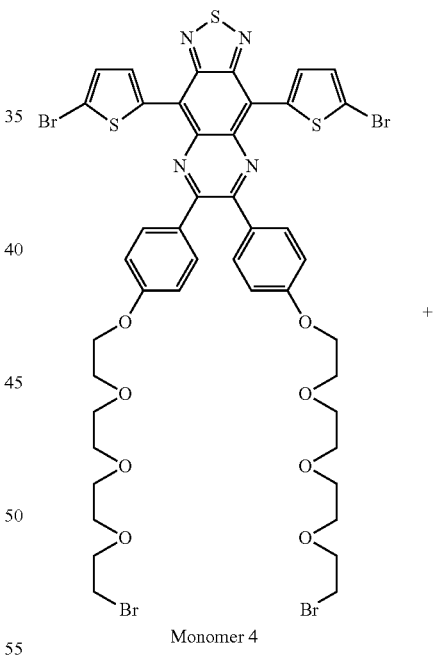

Monomer 4

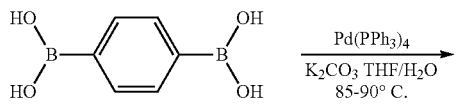

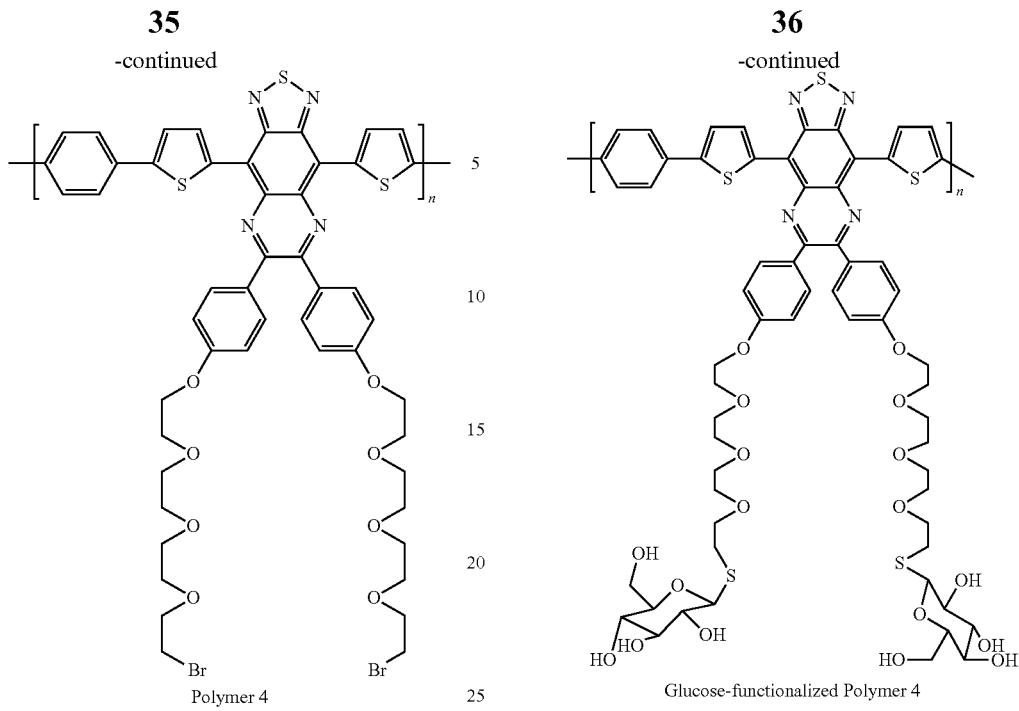

Polymer 4

Glucose-functionalized Polymer 4

0.2 mmol of Monomer 4 and 0.2 mmol of 1,4-phenylenediboronic acid, Pd(PPh$_3$)$_4$ (8 mg), KCO$_3$ (0.25 g) were placed in two-neck flask and degassed, and then refilled with N$_2$. 20 ml of THF and 8 ml of water were added, and reaction mixture was heated to 85° C., stirred for 24 hrs. The reaction mixture was cooled down to room temperature and then poured into CH$_3$OH. Collected precipitate was washed with CH$_3$OH several times and recrystallized from CH$_2$Cl$_2$/CH$_3$OH and washed with CH$_3$OH again and then dried by vacuum to give Polymer 4 as a black solid.

Scheme 12 below shows an example of the conversion of Polymer 4 to a bio-molecule derivatized water soluble polymer by attaching glucose to Polymer 4.

Scheme 12

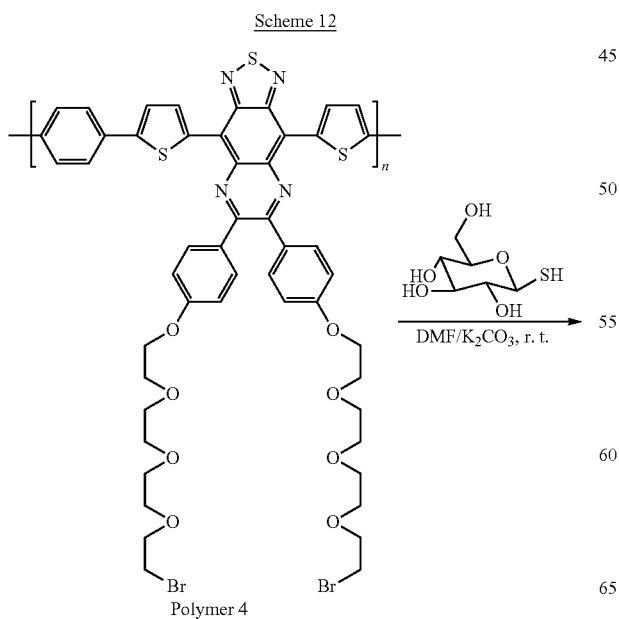

Polymer 4

0.2 g of Polymer 4 was dissolved in 8 ml of DMF in 25 mL single-neck round bottom flask. 0.2 g of 1-thio-β-D-glucose was added, following by 0.5 g of anhydrous K$_2$CO$_3$. The reaction mixture was stirred at room temperature for 30 hrs, and then transferred into a dialysis tube for dialysis against water for 2 days (10 water changes). The solution obtained in dialysis tube was then transferred into a single-neck round bottom flask. After removal of water, glucose-functionalized Polymer 4 was obtained as a black solid.

Glucose-functionalized Polymer 4 has good water solubility as shown in FIG. 3. On the left is an upper layer of aqueous phase (water) and a lower layer of Polymer 4 in CH$_2$Cl$_2$ solution. On the right is an upper layer of glucose-functionalized Polymer 4 in water solution and a lower layer of CH$_2$Cl$_2$.

Example 5

Synthesis of COOH-Functionalized Polymer 5

Scheme 13 below shows an example of the conversion of Polymer 2 to Polymer 5, with subsequent functionalization of Polymer 5 with carboxylic acid groups, making COOH-functionalized Polymer 5 water soluble.

Scheme 13
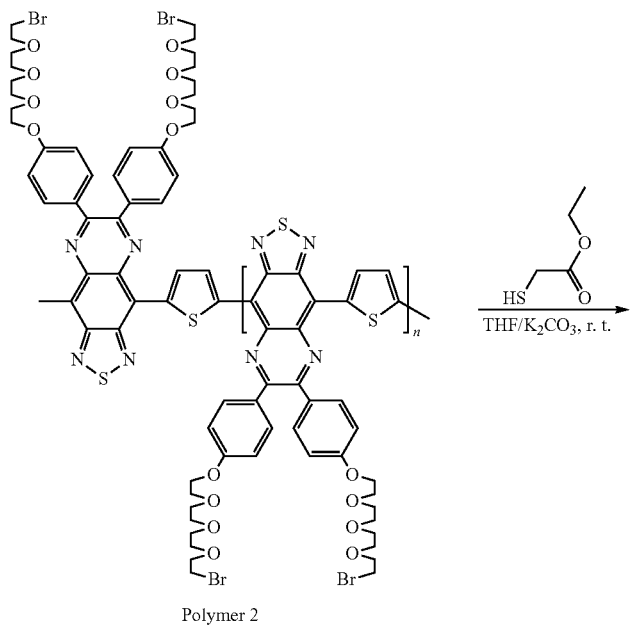
Polymer 2
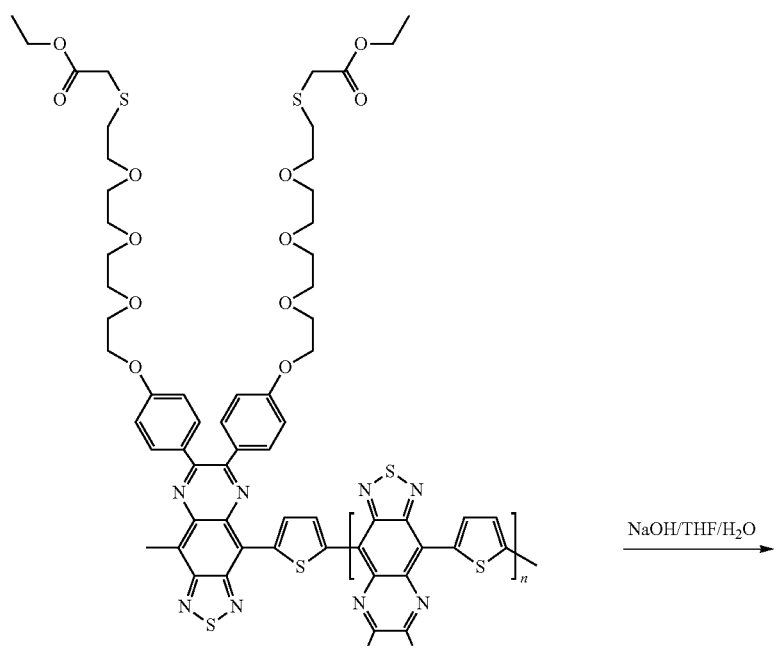

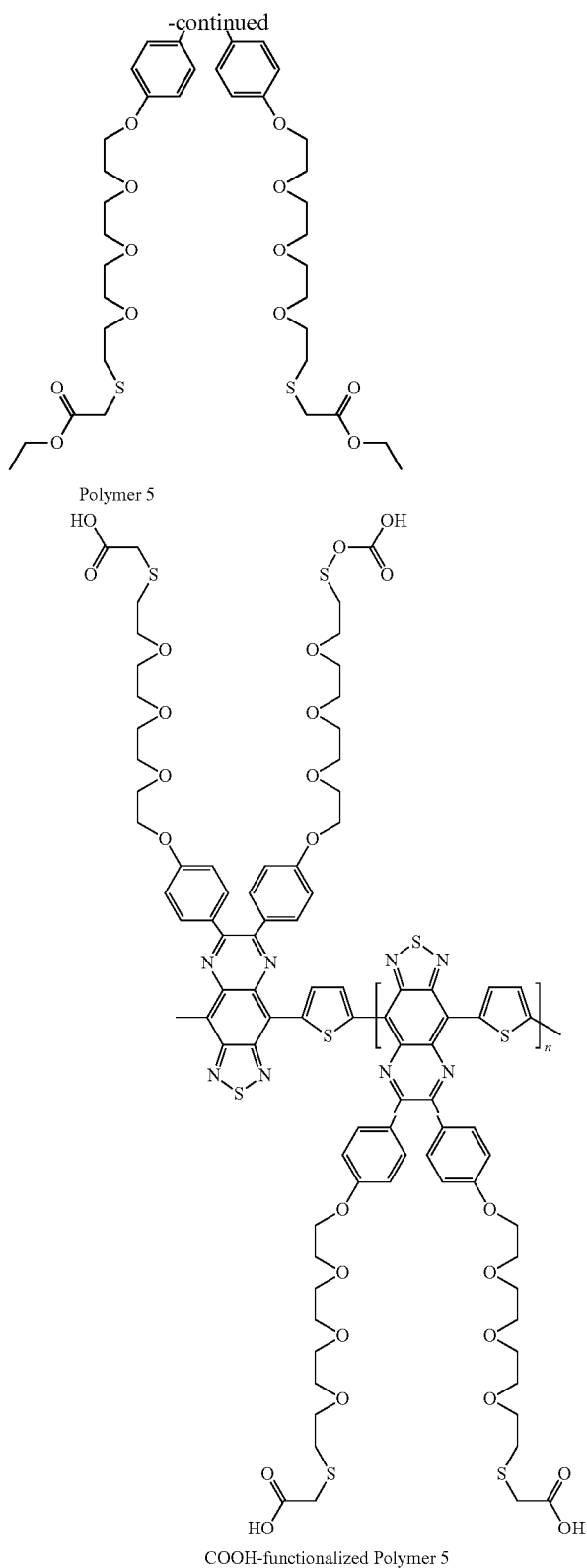

Polymer 5

COOH-functionalized Polymer 5

0.3 g of Polymer 2 was dissolved in 8 ml of THF in 25 mL single-neck round bottom flask. 0.4 g of $K_2CO_3$ was added, following by 0.5 ml of ethyl thioglycolate. After stirring at room temperature for 30 hrs, the whole mixture was poured into water and then filtered. The obtained solid was washed with water 2 times, then washed with $CH_3OH$ several times to yield Polymer 5. The obtained Polymer 5 was directly used to do next step hydrolysis as described below without further purification.

Polymer 5 was dissolved in 10 ml of THF, and a solution of NaOH (2.7 g) in water (1 ml) was added. A few seconds later after adding the NaOH solution, a large amount of dark precipitates occurred in the reaction mixture. The mixture was stirred for about 5 minutes and then transferred into a dialysis tube for dialysis against water. The dark precipitates soon completely dissolved in water in the dialysis tube and the mixture was dialyzed against water for 2 days (8 water changes). The solution in dialysis tube was then transferred into a single-neck round bottom flask and dried by lyophilization to give COOH-functionalized Polymer 5 as a dark solid.

COOH-functionalized Polymer 5 has very good water solubility and its absorption in water was measured and the spectrum is shown in FIG. 4. Maximum wavelength absorption of energy by the COOH-functionalized Polymer 5 can reach about 950 nm. The COOH-functionalized Polymer 5 shows a broad range of absorption beginning at about 700 nm in the visible region. The absorption continues past 1100 nm, which is well into the NIR region.

Example 6

Immobilization of Biotin to COOH-Functionalized Polymer 5

Scheme 14 below shows an example of the conversion of COOH-functionalized Polymer 5 to Biotin-immobilized Polymer 5.

Scheme 14

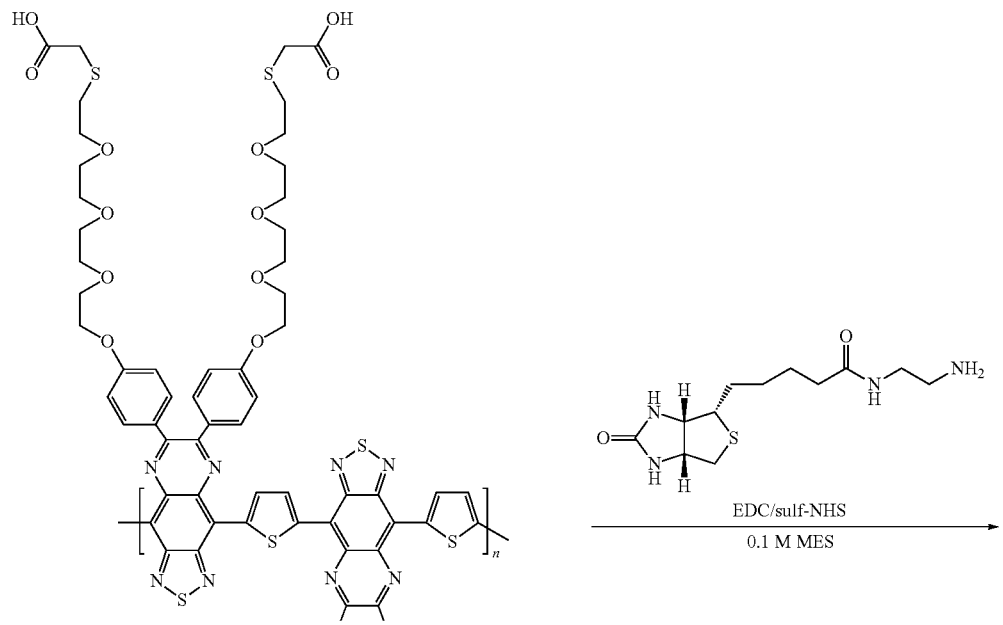

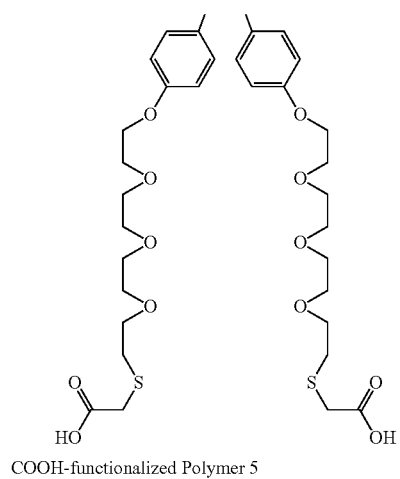

COOH-functionalized Polymer 5

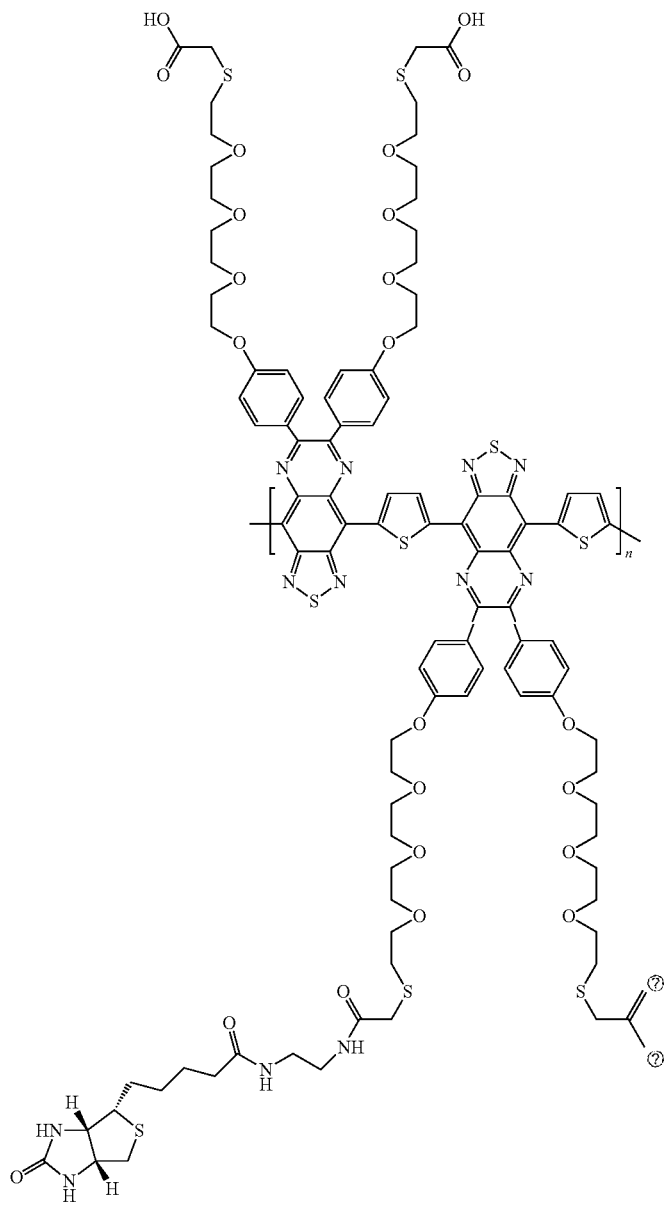

Biotin-immobilized Polymer 5

2.0 mg COOH-functionalized Polymer 5 was dissolved in 0.2 ml of 0.1M MES buffer. 1.0 mg EDC was dissolved in 0.1 mL DI water. 1.0 mg sulf-NHS was dissolved in 0.1 mL DI water. Then, 27 μl of this EDC solution and 50 μl of this sulf-NHS solution were added to the solution of step 1) and the whole mixture was incubated for 30 minutes. 1.0 mg biotin was dissolved in 0.1 ml DMSO. 25 μl of this solution was added to the mixture of step 2). The whole mixture was incubated for overnight under gentle stirring Then, the mixture was transferred into a dialysis tube for dialysis against water for 12 hrs (2 water changes). After dialysis, the solution was transferred into a vial to dry by lyophilization to give Biotin-immobilized Polymer 5.

Binding Experiments of Biotin-Immobilized Polymer 5 with Streptavidin Coated Magnetic Beads The above Biotin-immobilized Polymer 5 was used to incubate with streptavidin-coated magnetic beads following a reported procedure. The results, as observed by the naked eye, are shown in FIG. 5. On the left (FIG. 5A) is shown the binding experimental results for the streptavidin coated magnetic beads plus Biotin-immobilized Polymer 5. In the middle (FIG. 5B) is shown the control experimental results for the streptavidin coated magnetic beads plus COOH-functionalized Polymer 5. On the right (FIG. 5C) is shown only the streptavidin coated magnetic beads.

The binding and control experiments of the streptavidin coated magnetic beads and Biotin-immobilized Polymer 5 described above were carried out under the same conditions. After incubation, all the beads were washed with a coupling buffer 4 times. FIG. 5 results are shown for the beads resuspended in tris-buffer solution after the 4 washings. A color change can be visualized after the binding even without using fluorescence as signals to see the binding.

For comparative purposes, a commercial available NIR dye labeled biotin, atto 680-biotin, was used to do the same binding experiment. The atto 680-biotin used in the binding experiment is the same concentration and volume as Biotin-immobilized Polymer 5 used in the binding. FIG. 6 shows the results of beads binding with atto 680-biotin. On the left (FIG. 6A) is shown the atto 680-biotin only. In the middle (FIG. 5B) is shown the binding of the streptavidin coated magnetic beads and atto 680-biotin. On the right (FIG. 6C) is shown the streptavidin coated magnetic beads.

FIG. 7 shows comparative binding experimental results for magnetic beads binding with Biotin-immobilized Polymer 5 and atto 680-biotin. On the left (FIG. 7A) is shown the binding for the streptavidin coated magnetic beads plus Biotin-immobilized Polymer 5. In the middle (FIG. 7B) is shown the binding for the streptavidin coated magnetic beads plus the atto 680-biotin. On the right (FIG. 7C) is shown the streptavidin coated magnetic beads.

Because of the water solubility of the polymers and their optical properties in the NIR range, these polymers can be used as fluorescence signaling reagents in many bio-related applications in the life sciences, diagnostic testing markets, pharmaceutical market, and environmental testing and biological warfare agent detection markets.

The water-soluble polymers above can also be used to form thin films by applying much lower potential in aqueous solution.

These polymers can often be related to electro-conductive polymers with low band gaps. With both water soluble and electrically conductive properties, the polymers can be used in a biological related system for a number of applications, including as a conductor for electrical signals of biological origin and otherwise.

Any numbers expressing quantities of ingredients, constituents, reaction conditions, and so forth used in the specification are to be understood as being modified in all instances by the term "about". Notwithstanding that the numeric al ranges and parameters setting forth, the broad scope of the subject matter presented herein are approximations, the numerical values set forth are indicated as precisely as possible. Any numerical value, however, may inherently contain certain errors or inaccuracies as evident from the standard deviation found in their respective measurement techniques. None of the features recited herein should be interpreted as invoking 35 U.S.C. §112, ¶6, unless the term "means" is explicitly used.

Although the present invention has been described in connection with preferred embodiments thereof, it will be appreciated by those skilled in the art that additions, deletions, modifications, and substitutions not specifically described may be made without departing from the spirit and scope of the invention.

What is claimed is:

1. A polymeric material comprising: a copolymer of
a first monomer (1), (2) or (3); and
a second monomer (4), (5), (6) or (7);
wherein, (1) comprises:

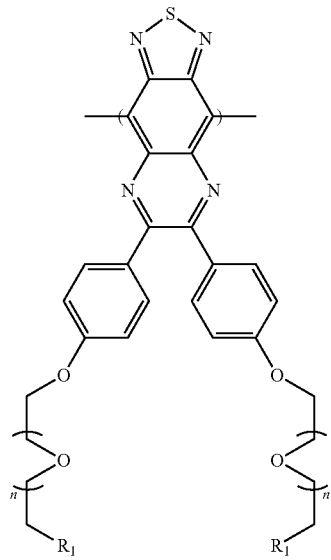

(2) comprises:

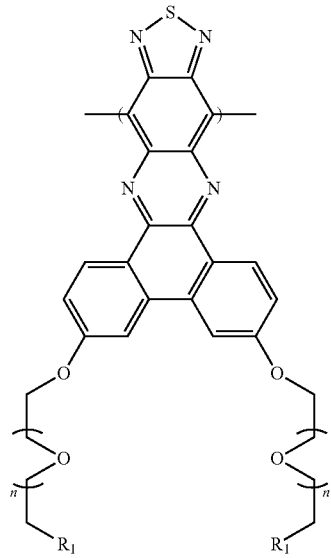

-continued (3) comprises:

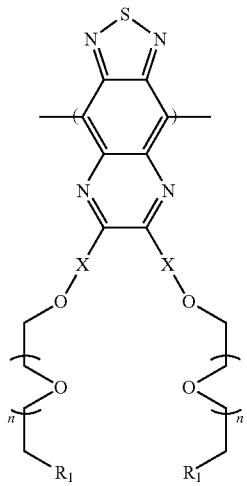

wherein
R₁=OH, Br, I, Cl, SH, COOH, NH₂, N(R₂)₃ (R₂ can be same or different), SR₂, SR₂COOH, SR₂NH₂, SR₂SO₃H, SR₂SH, SR₂OH, malemide, or NHS ester,
X=$C_0$-$C_3$ alkyl, aryl, substituted aryl, heteroaryl, or substituted heteroaryl,
R₂=Alkyl, aryl or heteroaryl, substituted aryl or substituted heteroaryl; and
n=0, 1, or an integer greater than 1; and (4) comprises:

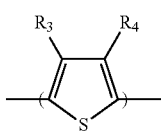

(5) comprises:

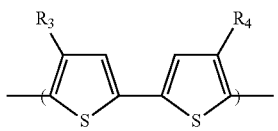

(6) comprises:

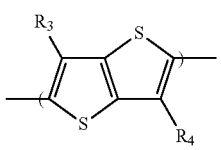

(7) comprises:

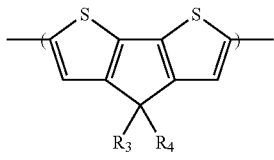

wherein R₃ and R₄=H or

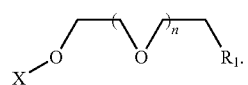

2. The polymeric material of claim 1, further comprising a third monomer (11), (12), (13), (14), (15), (16), (17), (18), or (19); wherein:

(11)

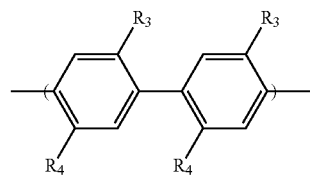

(12)

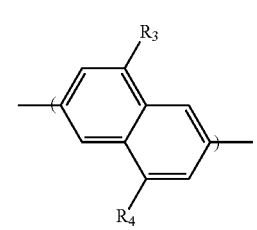

(13)

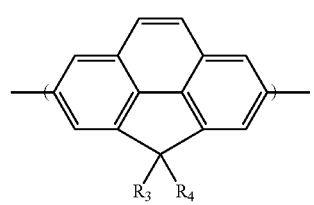

(14)

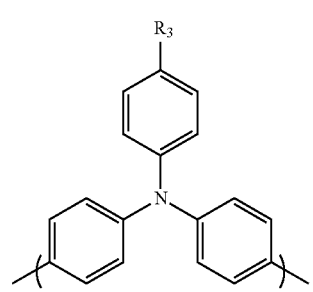

(15)

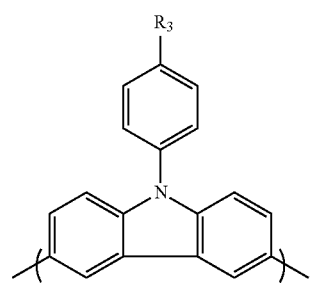

(16)
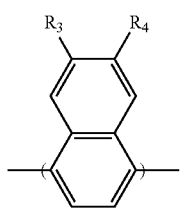
(17)
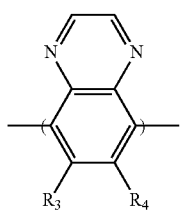
(18)
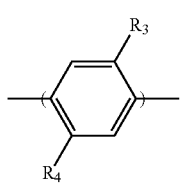
(19)
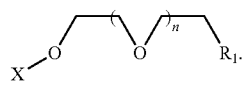
wherein R₃ and R₄=H or
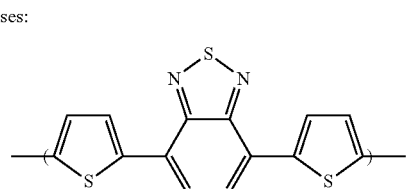
3. A polymeric material of claim 1 comprising: a copolymer of
a first monomer (8), (9) or (10); and
the second monomer (4), (5), (6) or (7);
wherein,
(8) comprises:
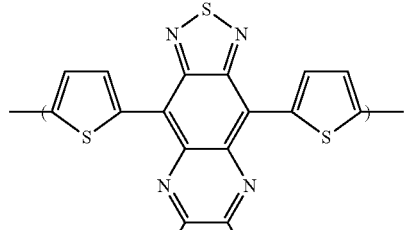
(9) comprises:

(10) comprises:

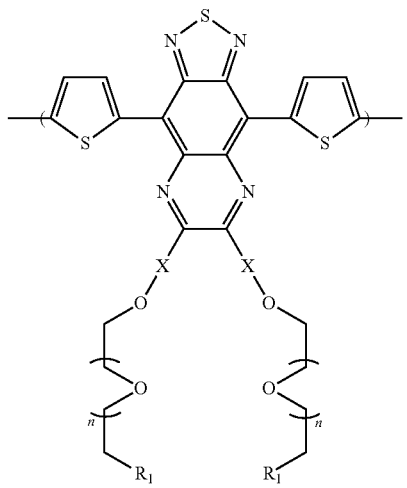

wherein

R$_1$=OH, Br, I, Cl, SH, COOH, NH$_2$, N(R$_2$)$_3$ (R$_2$ can be same or different), SR$_2$, SR$_2$COOH, SR$_2$NH$_2$, SR$_2$SOH, SR$_2$SH, SR$_2$OH, malemide, or NHS ester, X=C$_0$-C$_3$ alkyl, aryl, substituted aryl, heteroaryl, or substituted heteroaryl, and R'=Alkyl, aryl, heteroaryl, substituted aryl or substituted heteroaryl.

4. The polymeric material of claim 3, further comprising a third monomer (11), (12), (13), (14), (15), (16), (17), (18), or (19); wherein:

(11)
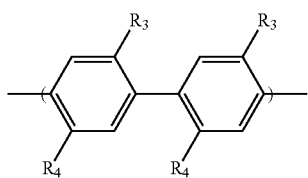

(12)
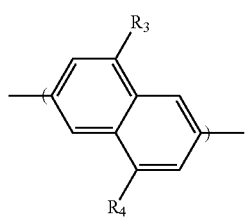

(13)
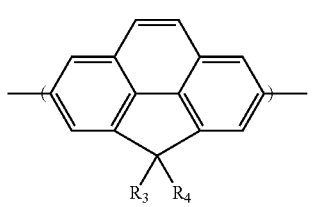

(14)
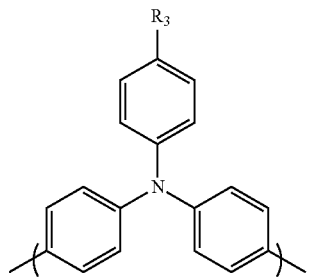

(15)
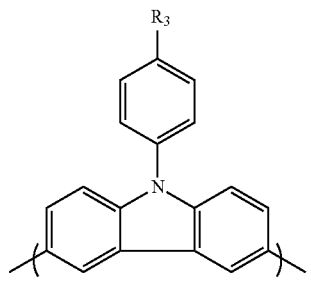

(16)
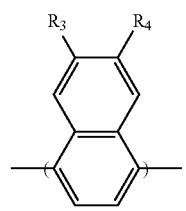

(17)
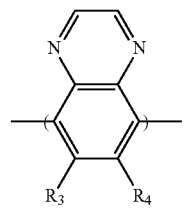

(18)
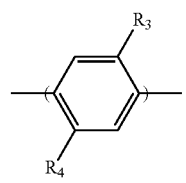

(19)
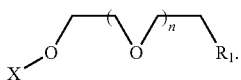

wherein R$_3$ and R$_4$=H or

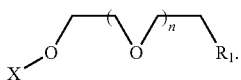

5. The polymeric material of claim 1, further comprising at least one functional unit.

6. The polymeric material of claim 5, wherein the at least one functional unit comprises one or more of: carbohydrates, proteins, peptides, DNA, RNA, antibodies, antigens, enzymes, bacteria, redox molecules, host molecules, guest molecules, haptens, lipids, microbes, sugars and aptamers.

7. The polymeric material of claim 5, wherein the polymeric material comprises at least one of the following:

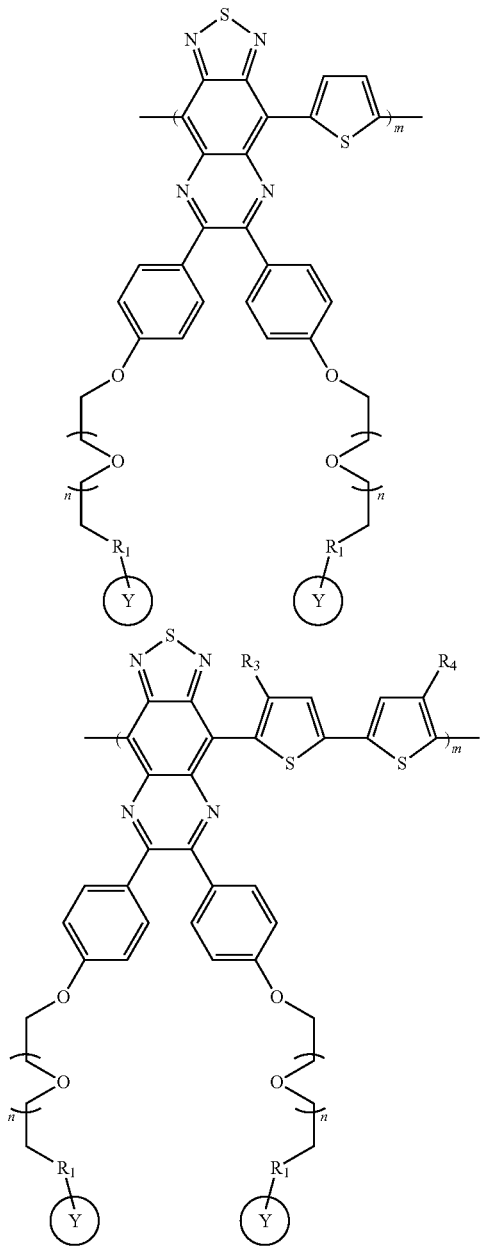

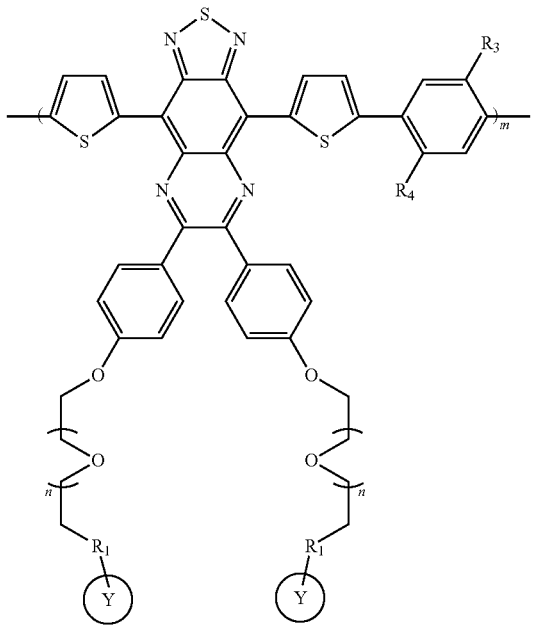

wherein:

$R_1$=OH, Br, I, Cl, SH, COOH, $NH_2$, $N(R_2)_3$ ($R_2$ can be same or different), $SR_2$, $SR_2COOH$, $SR_2NH_2$, $SR_2SO_3H$, $SR_2SH$, $SR_2OH$, malemide, or NHS ester, X=$C_0$-$C_3$ alkyl, aryl, substituted aryl, heteroaryl, or substituted heteroaryl, $R_2$=alkyl, aryl or heteroaryl, substituted aryl, substituted heteroaryl, and Y=one or more of carbohydrates, proteins, peptides, DNA, RNA, antibodies, antigens, enzymes, bacteria, redox molecules, host molecules, guest molecules, haptens, lipids, microbes, sugars and aptamers.

8. A polymeric material comprising a self-polymerized product of one of the monomers (1)-(19) as defined by claim 4.

9. The polymeric material of claim 7, wherein an absorption spectrum of the material comprises a maximum wavelength absorption of at least 600 nm.

* * * * *